US012592365B2

(12) United States Patent
Choi

(10) Patent No.: US 12,592,365 B2
(45) Date of Patent: Mar. 31, 2026

(54) PLASMA GENERATING APPARATUS

(71) Applicant: Peter Choi, Palaiseau (FR)

(72) Inventor: Peter Choi, Palaiseau (FR)

(73) Assignee: Peter Choi, Palaiseau (FR)

( * ) Notice: Subject to any disclaimer, the term of this patent is extended or adjusted under 35 U.S.C. 154(b) by 202 days.

(21) Appl. No.: 18/031,697

(22) PCT Filed: Oct. 14, 2021

(86) PCT No.: PCT/EP2021/078523
§ 371 (c)(1),
(2) Date: Apr. 13, 2023

(87) PCT Pub. No.: WO2022/079203
PCT Pub. Date: Apr. 21, 2022

(65) Prior Publication Data
US 2023/0386797 A1 Nov. 30, 2023

(30) Foreign Application Priority Data

Oct. 14, 2020 (FR) ...................................... 2010519

(51) Int. Cl.
*H01J 37/32* (2006.01)
(52) U.S. Cl.
CPC .. *H01J 37/32596* (2013.01); *H01J 37/32935* (2013.01); *H01J 37/3299* (2013.01)

(58) Field of Classification Search
CPC ........... H01J 37/32596; H01J 37/32944; H01J 37/32935; H01J 37/3299; H05H 1/481
See application file for complete search history.

(56) References Cited

U.S. PATENT DOCUMENTS 6,238,629 B1 * 5/2001 Barankova ............. F23J 15/025
422/186.04
10,297,431 B2 * 5/2019 Zelechowski ....... H01J 37/3444

* cited by examiner

*Primary Examiner* — Patrick C Chen
(74) *Attorney, Agent, or Firm* — Duane Morris LLP

(57) ABSTRACT

Apparatus for generating a plasma via the transient hollow cathode discharge effect is disclosed. The apparatus comprises a chamber comprising an inlet through which gas may enter the chamber and an outlet through which the gas may exit the chamber, a cathode electrode disposed in the chamber, the cathode electrode comprising a plurality of hollow cathodes, an anode electrode spaced apart from the cathode, a power supply, and a power supply controller configured to reduce a power level of the electrical power below a level required to maintain the plasma at the plurality of hollow cathodes, after electrical breakdown has occurred. Each hollow cathode comprises a through-thickness hole through which the gas may pass from one side of the cathode electrode to another side of the cathode electrode. A modular apparatus is also disclosed, comprising a plurality of plasma reactor modules arranged in series and/or in parallel.

24 Claims, 13 Drawing Sheets

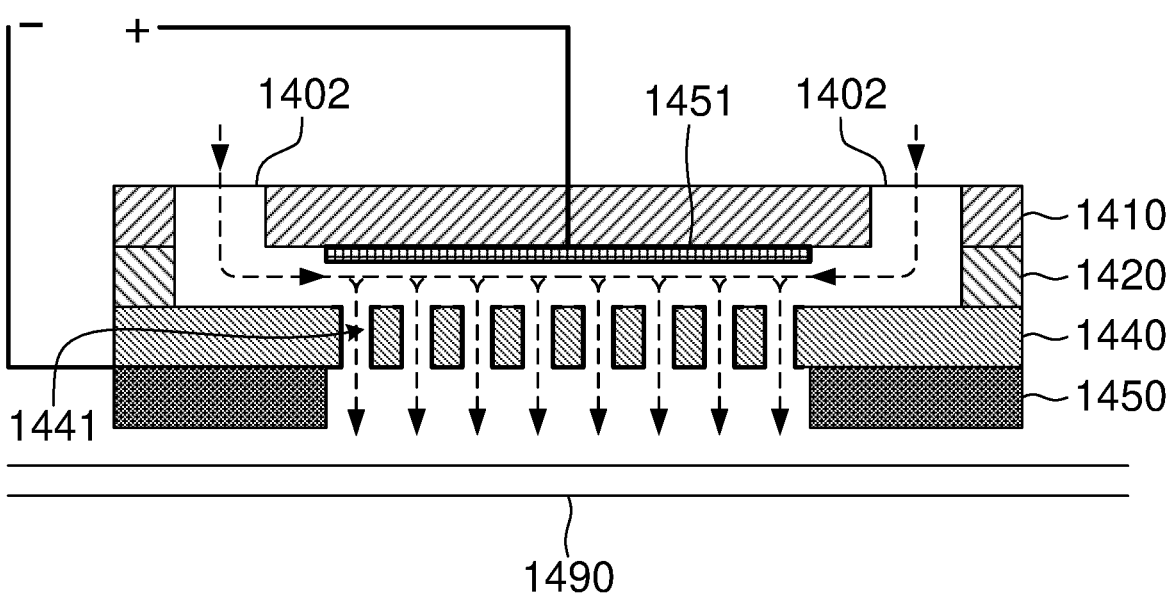
*FIG. 14*
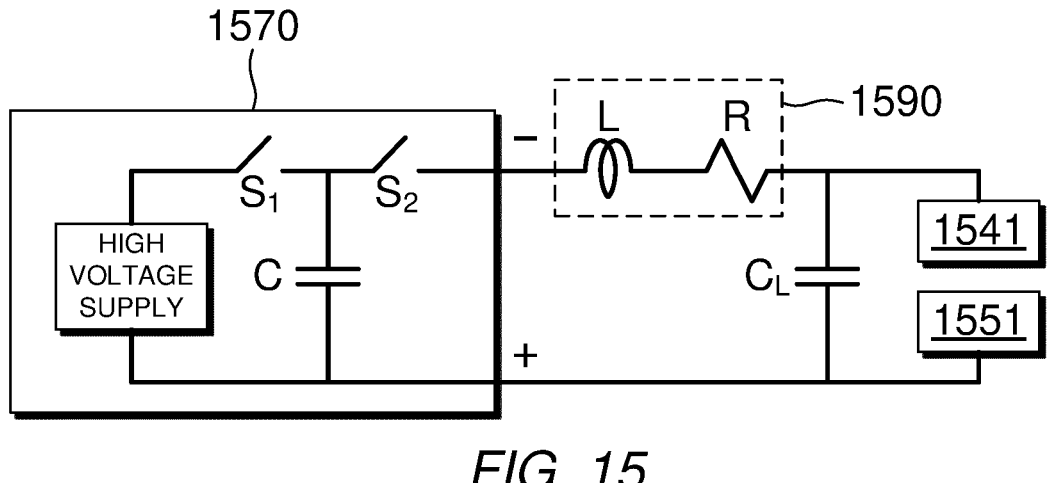
*FIG. 15*
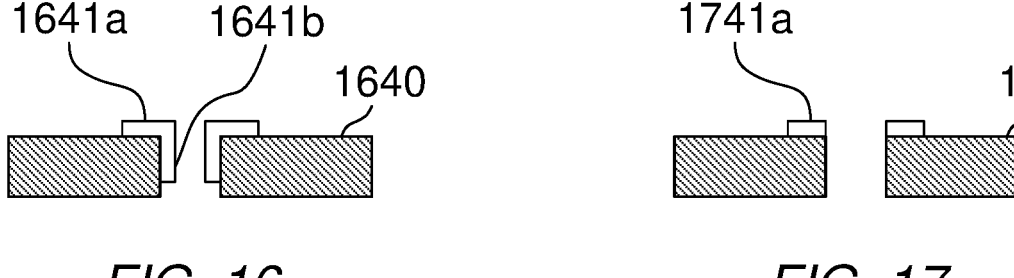
*FIG. 16*                    *FIG. 17*

PLASMA GENERATING APPARATUS

TECHNICAL FIELD

The present invention relates to apparatus for generating a plasma. More particularly, embodiments of the present invention relate to apparatus for generating a plasma via the transient hollow cathode discharge effect.

BACKGROUND

Various forms of apparatus for generating a plasma are known in the art, and have a wide range of applications. A plasma is a state of matter as distinct from solid, liquid or gas, and comprises a mixture of free electrons and a gas of positively charged ions. The unique chemical and physical properties of plasma can find use in many different applications, such as treating the surface of a material to achieve a desired property such as hydrophobicity or removing contaminants from the surfaces of physical objects.

The invention is made in this context.

SUMMARY OF THE INVENTION

According to a first aspect of the present invention, there is provided apparatus for generating a plasma via the transient hollow cathode discharge effect, the apparatus comprising: a chamber comprising an inlet through which gas may enter the chamber and an outlet through which the gas may exit the chamber; a cathode electrode disposed in the chamber, the cathode electrode comprising a plurality of hollow cathodes each comprising a through-thickness hole through which the gas may pass from one side of the cathode electrode to another side of the cathode electrode, wherein the apparatus is configured so as to define a gas flow pathway passing from the inlet to the outlet through the plurality of hollow cathode through-thickness holes; an anode electrode spaced apart from the cathode; a power supply electrically connected to the anode electrode and the cathode electrode for supplying electrical power to generate a plasma at the plurality of hollow cathodes; and a power supply controller configured to reduce a power level of the electrical power below a first power level required to maintain the plasma at the plurality of hollow cathodes, after electrical breakdown has occurred.

In some embodiments according to the first aspect, the power supply controller is configured to reduce the power level by stopping the supply of electrical power to the cathode and anode.

In some embodiments according to the first aspect, the power supply controller is configured to reduce the power level after electrical breakdown has occurred by supplying the electrical power at a level greater than or equal to the first power level for a predetermined period of time, wherein the predetermined period of time is a period of time sufficient for electrical breakdown to occur.

In some embodiments according to the first aspect, the apparatus comprises means for detecting a characteristic indicative of the occurrence of electrical breakdown, wherein the power supply controller is configured to reduce the power level of the electrical power below the first power level in response to the characteristic indicative of the occurrence of electrical breakdown being detected. For example, in some such embodiments the characteristic comprises a change in current and/or voltage.

In some embodiments according to the first aspect, the power supply controller is configured to control the power supply to intermittently supply the electrical power as a sequence of voltage pulses, and is configured to set a frequency of the voltage pulses in dependence on a rate of flow of gas through the chamber.

In some embodiments according to the first aspect, the inlet and the outlet are disposed on opposite sides of the cathode electrode.

In some embodiments according to the first aspect, the chamber is configured such that gas may only flow from one side of the cathode electrode to the other via the plurality of hollow cathodes.

In some embodiments according to the first aspect, the anode electrode is disposed on an opposite side of the cathode electrode to the inlet.

In some embodiments according to the first aspect, the anode electrode is arranged so as to form a gas flow barrier extending across a whole or part of a face of the cathode electrode opposite the anode electrode, such that gas exiting the hollow cathodes is deflected by the anode electrode so as to flow laterally across said face of the cathode electrode.

In some embodiments according to the first aspect, a separation distance between the anode electrode and the cathode electrode is set such that a resistance to gas flow laterally in a gap between the anode electrode and the cathode electrode is lower than a resistance to gas flow through the plurality of hollow cathodes such that a rate of gas flow through the chamber is dependent on the resistance to gas flow through the plurality of hollow cathodes.

In some embodiments according to the first aspect, a separation distance between the anode electrode and the cathode electrode is set such that a resistance to gas flow laterally in a gap between the anode electrode and the cathode electrode is higher than a resistance to gas flow through the plurality of hollow cathodes.

In some embodiments according to the first aspect, the apparatus comprises an electrically insulating or semi-insulating layer disposed between the anode electrode and the cathode electrode, so as to limit an amount of energy delivered to the plasma after electrical breakdown has occurred.

In some embodiments according to the first aspect, in use the apparatus is capable of generating the plasma while the gas in the chamber is at atmospheric pressure.

In some embodiments according to the first aspect, the plurality of hollow cathodes are arranged into a plurality of groups of hollow cathodes and the cathode electrode comprises a plurality of electrically conducting pathways, each one of said electrically conducting pathways connecting the hollow cathodes within one group to each other for supplying the electrical power to said group of hollow cathodes, and wherein the hollow cathodes of neighbouring groups are spaced apart from one another by an electrically insulating region.

In some embodiments according to the first aspect, the plurality of hollow cathodes are arranged in a plurality of rows on the cathode electrode, wherein one group comprises a plurality of hollow cathodes on one row and a neighbouring group comprises a plurality of hollow cathodes on an adjacent row.

In some embodiments according to the first aspect, an inner surface of each hollow cathode comprises a coating of a material toxic to biological specimens. For example, the material may comprise gold, silver, palladium and/or copper.

In some embodiments according to the first aspect the power supply is a capacitive drive circuit comprising a voltage source having a high voltage terminal and a low voltage terminal, a first switch connected between the high voltage terminal and a first node, a second switch connected between the first node and a second node, a first inductor connected between the second node and a third node via a resistor, a second inductor connected between the third node and a high voltage output, wherein the high voltage output is connected to the cathode electrode, a first capacitor connected between the first node and the low voltage terminal, a second capacitor connected between the third node and the low voltage terminal, wherein the low voltage terminal is further connected to the anode electrode.

In some embodiments according to the first aspect the anode electrode comprises an integrated isolating capacitor, the anode electrode comprising a top electrode in the form of a first conductive layer, an intermediate electrode in the form of a second conductive layer, the first and second conductive layers being separated by an insulating dielectric and connected to one another via a conducting pathway passing through the insulating dielectric, and a bottom electrode in the form of a third conductive layer separated from the second conductive layer by the insulating dielectric, wherein the second and third conductive layers together function as the integrated isolating capacitor.

According to a second aspect of the present invention, there is provided a modular apparatus comprising a plurality of plasma reactor modules each comprising an apparatus according to the first aspect.

In some embodiments according to the second aspect, two or more of the plasma reactor modules are connected in series such that gas exiting the outlet of one of said plasma reactor modules then enters the inlet of the next one of said plasma reactor modules in series.

In some embodiments according to the second aspect, a number of the plasma reactor modules connected in series is selected so as to achieve a desired characteristic of gas exiting the modular apparatus after passing through the number of plasma reactor modules.

In some embodiments according to the second aspect, two or more of the plasma reactor modules are connected in parallel so as to define a plurality of gas flow paths through the modular apparatus such that gas entering the modular apparatus is divided among the plurality of gas flow paths, and a portion of said gas flowing along each of the gas flow paths must only pass through a corresponding one of said plasma reactor modules connected in parallel before exiting the modular apparatus.

In some embodiments according to the second aspect, a number of the plasma reactor modules connected in parallel is selected so as to achieve a desired rate of gas flow through the modular apparatus.

According to a third aspect of the present invention, there is provided a capacitive drive circuit comprising a voltage source having a high voltage terminal and a low voltage terminal, a first switch connected between the high voltage terminal and a first node, a second switch connected between the first node and a second node, a first inductor connected between the second node and a third node via a resistor, a second inductor connected between the third node and a high voltage output, wherein the high voltage output is connected to the cathode electrode, a first capacitor connected between the first node and the low voltage terminal, a second capacitor connected between the third node and the low voltage terminal, wherein the low voltage terminal is further connected to the anode electrode.

According to a fourth aspect of the present invention, there is provided a structure for use as an anode electrode in an electrical device, the structure comprising an integrated isolating capacitor, the anode electrode comprising a top electrode in the form of a first conductive layer, an intermediate electrode in the form of a second conductive layer, the first and second conductive layers being separated by an insulating dielectric and connected to one another via a conducting pathway passing through the insulating dielectric, and a bottom electrode in the form of a third conductive layer separated from the second conductive layer by the insulating dielectric, wherein the second and third conductive layers together function as the integrated isolating capacitor.

BRIEF DESCRIPTION OF THE DRAWINGS

Embodiments of the present invention will now be described, by way of example only, with reference to the accompanying drawings, in which:

FIG. 14 illustrates a cross-sectional view through an apparatus for generating a plasma in which gas enters the apparatus on the same side as the anode electrode, according to an embodiment of the present invention;

FIG. 15 illustrates a circuit for supplying electrical power to apparatus for generating a plasma, according to an embodiment of the present invention;

FIG. 16 illustrates a hollow cathode comprising a conductive surface on the inlet-side of the cathode electrode with an inner conductive surface which extends part of the way through the hollow cathode, according to an embodiment of the present invention;

FIG. 17 illustrates a hollow cathode comprising a conductive surface on the inlet-side of the cathode electrode without any conductive surface on the inside of the through-hole, according to an embodiment of the present invention;

DETAILED DESCRIPTION

Figure 1:
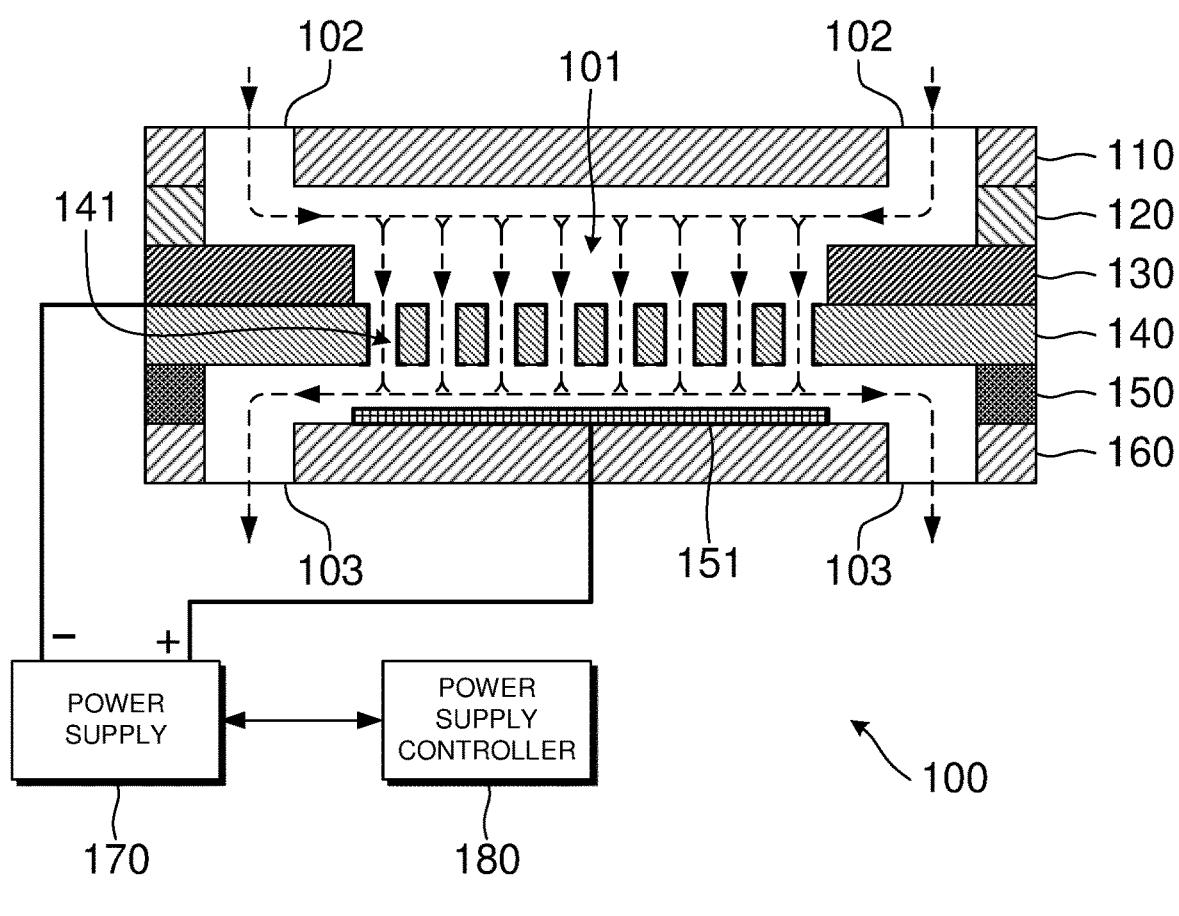
FIG. 1 illustrates a cross-sectional view through an apparatus for generating a plasma, according to an embodiment of the present invention.

In the following detailed description, only certain exemplary embodiments of the present invention have been shown and described, simply by way of illustration. As those skilled in the art would realise, the described embodiments may be modified in various different ways, all without departing from the scope of the present invention. Accordingly, the drawings and description are to be regarded as illustrative in nature and not restrictive. Like reference numerals designate like elements throughout the specification.

Throughout the following description, the terms "gas" and "gas flow" are used to describe various aspects of the construction and operation of the apparatus in embodiments of the present invention. It should be understood that during operation, the fluid medium flowing through the apparatus will in reality comprise a mixture of gaseous species and plasma products. Accordingly, references herein to a "gas" should therefore be construed broadly as also encompassing plasma products.

Referring now to FIG. 1, apparatus for generating a plasma is illustrated in cross-section according to an embodiment of the present invention. As will become apparent from the following description, the apparatus is configured so as to generate the plasma via the transient hollow cathode discharge effect. The apparatus 100 comprises a chamber 101 comprising one or more inlets 102 through which gas may enter the chamber, and one or more outlets 103 through which the gas may exit the chamber. The apparatus 100 also comprises a cathode electrode 140 disposed in the chamber 101, an anode electrode 151 spaced apart from the cathode, a power supply 170, and a power supply controller 180. In the present embodiment the anode electrode 151 is disposed on an opposite side of the cathode electrode 140 to the one or more inlets 102, but in other embodiments the anode electrode 151 could be disposed on the same side of the cathode electrode 140 as the one or more inlets 102.

In the present embodiment the apparatus 100 is constructed from a stack of planar components 110, 120, 130, 140, 150, 160, which may be referred to as "plates". Each plate includes one or more holes or channels through which gas may flow, with the holes or channels in adjacent plates being aligned such that once assembled in the order shown in FIG. 1, the holes and/or channels together define a pathway through which gas may flow through the apparatus 100 from one side to the other. For convenience, the plurality of holes and/or channels which once connected provide a continuous pathway for the flow of gas through the apparatus will hereinafter be referred to as a "chamber" 101. The term "chamber" should be construed broadly as meaning any space inside the apparatus within which gas may flow, without being limited to any particular size or shape.

It should be understood that this particular construction is described purely by way of an example, and should not be considered limiting. In other embodiments the apparatus may be constructed differently. For example, in another embodiment the apparatus may comprise a housing that is shaped so as to define the chamber within the apparatus. The housing may be formed in two or more parts which, once assembled, define the chamber. The two or more parts may be assembled in such a way that one or more of the parts may be removed to allow access to the interior of the apparatus, for example using mechanical fixings such as bolts or clips, so as to allow for maintenance or repair of components inside the apparatus such as the cathode 140 or anode 151. Each part of the housing may be formed by any suitable fabrication method, including but not limited to casting, injection moulding, 3D printing, milling, and so on.

Figure 2:
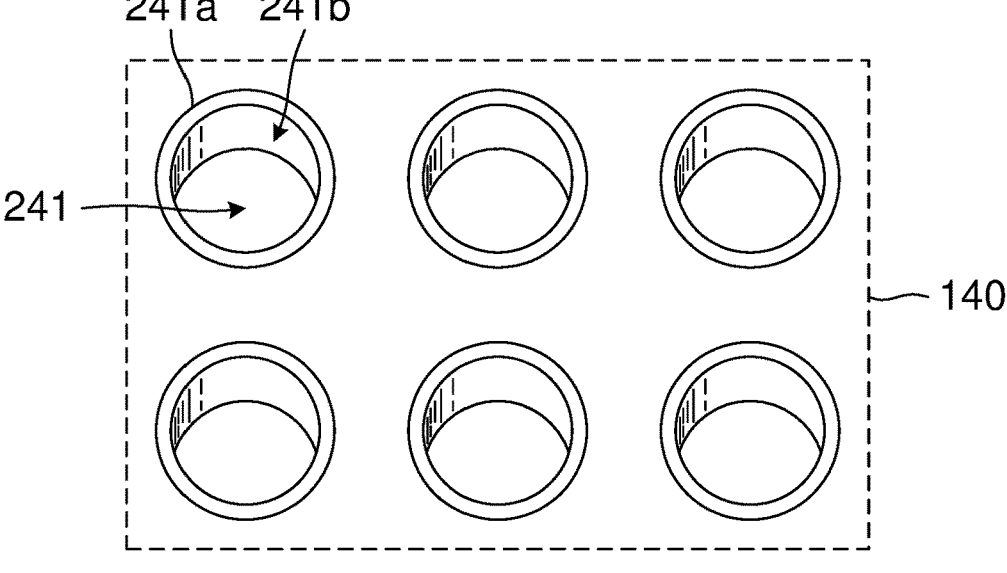
FIG. 2 illustrates a portion of a cathode electrode comprising a plurality of hollow cathodes, according to an embodiment of the present invention.

The cathode electrode 140 comprises a plurality of hollow cathodes 141, each of which comprises a through-thickness hole through which the gas may pass from one side of the cathode electrode 140 to another side of the cathode electrode 140, as shown by the dashed arrows in FIG. 1 which indicate the flow of gas through the apparatus 100 during operation. A portion of the cathode electrode 140 comprising six hollow cathodes 241 is illustrated in FIG. 2, according to an embodiment of the present invention. In the embodiment of FIG. 2 each hollow cathode 241 comprises a ring-shaped electrode 241a facing the anode 151, and comprises a conducting path 241b on an inner surface of the hollow cathode 241 which connects the anode-side ring-shaped electrode 241a to the opposite side of the cathode electrode 140. In other embodiments the anode-side ring-shaped electrode 241a, and/or a whole or a part of the conducting path 241b on the inner surface of the hollow cathode 241, may be omitted.

In embodiments in which the apparatus 100 is used to remove biological contaminants such as airborne virus particles or bacteria from a gaseous medium, the inner surface of each hollow cathode 141, 241 may comprise a coating of a material toxic to biological specimens, such as gold, silver, palladium or copper, or their alloys, for more effective decontamination of the gaseous medium. In some embodiments the material toxic to biological specimens may be included in nano-particle form so as to increase the surface of the material that is exposed to gas flow.

In the present embodiment, the chamber 101 is configured such that gas may only flow from one side of the cathode electrode 140 to the other via the plurality of hollow cathodes 141. This ensures that any gas exiting from the one or more outlets 103 must have passed through at least one of the hollow cathodes 141. Such an arrangement may be particularly advantageous in embodiments in which the apparatus 100 is used to treat a gaseous medium flowing through the chamber 101, by ensuring that all gas exiting the apparatus 100 will have been exposed to the plasma environment within a hollow cathode 141. In other embodiments, however, it may not be necessary to ensure that all gas passes through the hollow cathodes 141. For instance in embodiments in which the apparatus is used to produce a supply of ions, for example for subsequent acceleration into an ion beam, it may be acceptable to have imperfect sealing of the cathode electrode 140 in the chamber such that a portion of gas is able to bypass the hollow cathodes 141.

Each hollow cathode 141, 241 may have a suitable diameter to be capable of triggering a transient hollow cathode discharge. For example, each hollow cathode 141, 241 may have a diameter of the order of 1-2 millimetres (mm), although it should be appreciated that this range is given by way of an example only and other diameters may be used in other embodiments. In some embodiments the diameter of each hollow cathode 141, 241 may be less than 100 micrometres, whilst in other embodiments the diameter may be greater than 1 centimetre. The diameters of the hollow cathodes 141, 241 may be selected taking into consideration other design parameters, such as the operating pressure of the gaseous medium separating the anode 151 and the cathode 140. The ratio of the diameter, D, of the hole to the thickness, H, of the cathode 140, i.e. D/H, dictates the electric field penetration into the hollow cathode 141 for a given applied voltage across the anode 151 and cathode 140. The smaller the value of D/H, the lower the value of the electric field that penetrates into the hollow cathode back space.

Typical D/H ratios may be in the range from 1 to 0.5, depending on the operating pressure of the apparatus, although values outside of this range may still be used in some embodiments.

The power supply 170 is electrically connected to the anode electrode 151 and the cathode electrode 140 for supplying electrical power to generate a plasma at the plurality of hollow cathodes 141. The power supply 170 may comprise any suitable form of power supply suitable for supplying electrical power in such a way as to be able to generate the plasma via the transient hollow cathode discharge effect. By making use of the transient hollow cathode discharge, embodiments of the present invention are able to create a region of ultra-high electric field (e.g. greater than $1 \times 10^7$ V/cm) for efficient production of energetic electrons. Since the principle of the transient hollow cathode discharge is well established, for the sake of brevity a detailed description will not be provided here. Nevertheless, without wishing to be bound by theory, a brief explanation of the transient hollow cathode discharge phenomenon is set out below so as to aid understanding of the present invention.

The transient hollow cathode discharge phenomenon refers to the physical events that take place from the point at which a voltage is established across a hollow cathode structure and an anode, to the formation of a conducting plasma channel between the anode and cathode. The magnitude of the applied voltage should be high enough such that the mean free path of an electron ejected from the hollow cathode and accelerated by the applied electric field across the anode-cathode space (hereinafter referred to as the A-K gap) is comparable to or larger than the physical dimension of the A-K gap. The power supply 170 may therefore be configured to apply a sufficiently high voltage across the cathode electrode 140 and anode 151, taking into account the distance between the cathode 140 and anode 151 in any given embodiment.

Additionally, the power supply 170 should be capable of establishing the voltage across the cathode 140 and anode 151 sufficiently quickly (e.g. of the order of 100 nanoseconds) to allow the ionization growth process to evolve in a quasi-stationary condition. The amplitude of the voltage applied may then remain approximately constant within the time scale for the formation of the transient hollow cathode discharge. The rapid establishment of the voltage across the cathode 140 and anode 151 sets up a quasi-stationary electric field configuration, with a near uniform high electric field over the bulk of the surface of the cathode 140, except close to the hollow cathode holes 141. At each of the through-thickness holes the electric field penetrates into the hollow cathode 141, leaching into the backside of the cathode electrode 140, albeit at a much lower value compare with that in the A-K gap.

In some embodiments, the apparatus may comprise one or more capacitors connected between the power supply 170 and one or more of the hollow cathodes 141. In this way the power supply 170 provides power to the hollow cathodes 141 via the capacitor, which acts as an intermediate energy store. The capacitor may be located physically close to the respective one or more hollow cathodes to which it provides power, for example by having the capacitor located on the cathode electrode 140 itself. The capacitor may in turn be connected to the respective one or more hollow cathodes through a suitably low inductance, so as to enable the capacitor to provide power to the one or more hollow cathodes with a sufficiently fast rise time (typically of the order of 100 nanoseconds) to allow the ionization growth process to evolve in a quasi-stationary condition, as described above. The use of a capacitor in this way can also help to achieve a sufficiently long decay time (typically of the order of tens of microseconds) to maintain a near constant voltage at the one or more hollow cathodes for the duration of discharge formation during a transient hollow cathode discharge cycle.

The electric field within each hollow cathode hole 141 causes free electrons to be generated within each hole 141, as well as in the hollow cathode back space within the chamber 101, close to the surface of the cathode electrode 140. Once an electron exits the hole 141 on the anode side of the cathode electrode 140 it is then accelerated rapidly towards the anode 151, gaining substantial energy due to the high electric field in the A-K gap. The large mean free path of such free electrons in comparison with the A-K gap distance means that there is little chance for ionization growth within the A-K gap due to collisional ionization, and ionization growth through electron multiplication will not take place.

At the same time, any ions that may be created through electron impact with the gaseous medium in the A-K gap, or with the surface of the anode 151, will be accelerated back through the hollow cathodes 141. However, such ions will travel much slower than the electrons in the A-K gap due to the large difference in mass. This leads to the creation of a positive space charge initially localized near the anode 151 surface, as the ions move more slowly than the electrons, and a dilute plasma begins to form between the space charge and the anode 151. The presence of this conducting plasma effectively moves the anode potential to the position of the space charge, creating a virtual anode which reduces the effective distance of the A-K gap and therefore increases the magnitude of the electric field in the remaining non-conducting space in the A-K gap, as well as that inside the hollow cathodes 141. The increase in electric field in turn accelerates the electron growth process, leading to a rapid advancement of the virtual anode towards the cathode 140 and further increasing the electric field around the hollow cathode holes 141, until finally the virtual anode penetrates into the hollow cathodes 141. This ultimately leads to the creation of a positive space charge inside the hollow cathodes 141, just inside the cathode backspace. At the penetration of the virtual anode into the cathode backspace, a point-like plasma zone exists which becomes a copious source of electrons.

The electrical breakdown process is then completed by the creation of a conducting channel connecting the anode 151 and the cathode 140, which effectively terminates the THCD processes. The power supply controller 180 is configured to reduce a power level of the electrical power that is supplied by the power supply 170 after electrical breakdown has occurred. Specifically, the power supply controller 180 is configured to reduce the power level below the level that is required to maintain the plasma at the plurality of hollow cathodes 141, which may be referred to as a first threshold power. In the present embodiment the power supply controller 180 is configured to reduce the power level effectively to zero by stopping the supply of electrical power to the cathode 140 and anode 151. For example, the power supply controller 180 may open a switch connecting the power supply 170 to the cathode 140 and/or to the anode 151, so as to break the electrical circuit and stop current flowing to the cathode 140 or anode 151. In other embodiments the power supply controller 180 may decrease the level of power to a second power level lower than the first threshold power, such that the plasma is effectively switched off whilst still supplying electrical power at a lower, finite, level.

It should be understood that in a real-world implementation, it may not be practical to stop or decrease the supply of electrical power at the exact moment that electrical breakdown occurs. In reality, the power supply controller 180 may reduce the power level a short but finite time after electrical breakdown has occurred, where the length of time between electrical breakdown occurring and the supply of electrical power being reduced or switched off is sufficiently short that any thermal heating of the plasma during this time is negligible. In some embodiments the power supply controller 180 may actively monitor the apparatus 100 during operation to detect a characteristic indicative of electrical breakdown occurring, and reduce the power level below the first threshold power in response to the characteristic being detected. In this way, the power supply controller 180 may ensure that power continues being supplied at a sufficiently high level until electrical breakdown occurs, and may then respond quickly to the occurrence of electrical breakdown to avoid any significant heating of the plasma.

In other embodiments, instead of detecting a characteristic indicative of electrical breakdown, the power supply controller 180 may be configured to reduce the power level below the first threshold power after electrical breakdown has occurred by controlling the power supply 170 to supply the electrical power at a level greater than or equal to the first power level for a predetermined period of time, wherein the predetermined period of time is a period of time sufficient for electrical breakdown to occur. In other words, the power supply controller 180 may be predesigned or pre-programmed so as to automatically reduce the level of power after a certain time has elapsed from the start of supplying electrical power at a high level equal to or greater than the first threshold power, without actively checking to see if electrical breakdown has occurred. This may simplify the design of the power supply controller 180 and the apparatus 100 as a whole, by removing the need for any such monitoring capability.

By limiting the electrical energy delivery to the electrodes 140, 151 after electrical breakdown has occurred, when a conducting plasma channel has been created, in this way the power supply controller 180 can avoid heating the channel to become a hot plasma. Consequently the apparatus 100 produces relatively little heat during operation. Reducing the level of power after electrical breakdown has occurred, so as to avoid any significant heating of the plasma, can also permit a very large set of hollow cathodes to be integrated into a small volume without the need for active cooling that may otherwise be required to remove thermal energy resulting from the formation of a hot plasma.

A further benefit of reducing the level of power once electrical breakdown has occurred is that the apparatus 100 can be operated in a pulsed manner in which plasma is repeatedly generated and switched off at short time intervals, without excessive heating of the apparatus 100. In a pulsed mode of operation, the power supply controller 180 may wait a certain time after reducing the power level to a level below the first threshold power, and then increase the power level to a level equal to or greater than the first threshold power to start a new cycle of plasma generation. In this way the power supply controller 180 can be configured to control the power supply to intermittently supply the electrical power as a sequence of voltage pulses.

In embodiments in which the apparatus 100 is operated in a pulsed mode of operation, the power supply controller may be configured to set a frequency of the voltage pulses in dependence on a rate of flow of gas through the chamber. In such embodiments, the delay between two pulses, i.e. to cycles of plasma generation, should preferably be longer than the recombination times of the various ionized species in the plasma, in order that the gaseous medium in the system can return from a conducting plasma state to a non-conducting state before the application of the successive pulse. At the same time, in embodiments in which the apparatus 100 is used for continuous plasma treatment of a gaseous medium, for more effective treatment the delay between two pulses should preferably be less than the residence time of the flowing medium through the reaction zone. In other words, a higher pulse frequency can be set for higher gas flow rates (i.e. higher throughput systems) to maintain effective treatment of the gaseous medium flowing through the apparatus 100.

In some embodiments the apparatus may be capable of generating the plasma while the gas in the chamber is at atmospheric pressure. For example, this may be achieved by appropriate selection of parameters such as the applied voltage, A-K gap distance, hollow cathode diameter, hollow cathode hole depth, and so on. In other embodiments the apparatus may operate at a pressure below atmospheric pressure.

Figure 3:
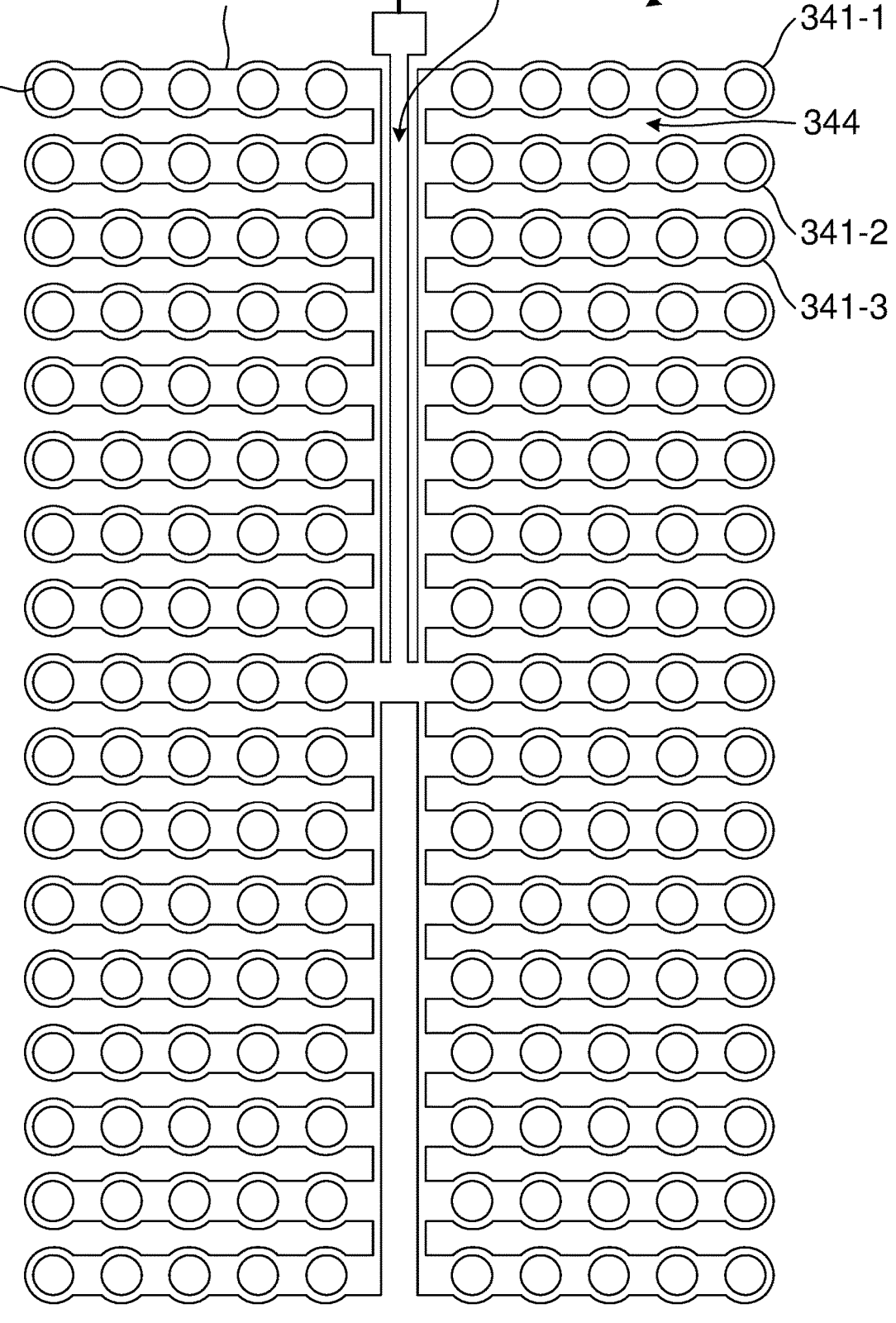
FIG. 3 illustrates a cathode electrode comprising a plurality of hollow cathodes arranged into groups connected by respective electrically conducting pathways, according to an embodiment of the present invention.

Referring now to FIG. 3, a cathode electrode comprising a plurality of hollow cathodes arranged into groups connected by respective electrically conducting pathways is illustrated, according to an embodiment of the present invention. The plurality of hollow cathodes 141 in the cathode electrode 140 of FIG. 1 are laid out as shown in FIG. 3. It should be understood that the cross-section illustrated in FIG. 1 is a simplified representation to aid understanding of the present invention, and does not represent a real physical cross-section through the plurality of hollow cathodes 340 illustrated in FIG. 3.

In the present embodiment the plurality of hollow cathodes are arranged in a regular array comprising orthogonal rows and columns. However, in other embodiments the plurality of hollow cathodes may be arranged differently to the embodiment shown in FIG. 3. For example, in one embodiment the plurality of hollow cathodes may be arranged on a hexagonal grid in close-packed fashion. In another embodiment the plurality of hollow cathodes may be arranged irregularly across the surface of the cathode electrode.

Continuing with reference to FIG. 3, in the present embodiment the plurality of hollow cathodes 340 are arranged into a plurality of groups of hollow cathodes 341-1, 341-2, and the cathode electrode comprises a plurality of electrically conducting pathways 342. The cathode electrode comprises a plurality of hollow cathodes 340 arranged into two columns either side of a central power line 343 which acts as a common voltage source, to which the electrically conducting pathways 342 are connected. Each column comprises seventeen rows of five hollow cathodes 341, giving (2×5×17)=170 hollow cathodes in total. However, in other embodiments the cathode electrode may comprise a different number of hollow cathodes. Each of the electrically conducting pathways 342 connects the hollow cathodes 341 within one group to each other for supplying power to the whole group. The hollow cathodes of neighbouring groups 341-1, 341-2 are spaced apart from one another by an electrically insulating region 344. In the present embodiment, in which the plurality of hollow cathodes are arrange in rows on the cathode electrode, "neighbouring" groups refers to the groups 341-1, 341-2 of hollow cathodes on adjacent rows.

By arranging the plurality of hollow cathodes 341 into groups in this way, such that the plurality of groups are each separately connected to a common voltage source 343, it is possible to operate all of the hollow cathodes simultaneously despite being powered by a common voltage source 343. As a result of this arrangement, each group of hollow cathodes 341-1, 341-2 are at a similar distance from the central power line 343, reducing the risk of any given hollow cathode being starved of electrical energy when breakdown occurs.

An advantage of using the transient hollow cathode discharge to generate the plasma at the plurality of hollow cathodes is that this enables self-synchronization of the initial ionization growth process among a collection of densely packed hollow cathodes, without the need for a ballast. This arises because the relatively long delay in the ionization growth process from the moment of voltage application, in a transient hollow cathode discharge configuration, yields more or less similar ionization growth rate among a group of hollow cathodes. The way in which the final electrical breakdown is controlled by the ionization growth at the cathode backspace means that the onset of electrical breakdown in one particular hollow cathode 341 in a group 341-2 directly accelerates the breakdown of the hollow cathodes in other neighbouring hollow cathodes, i.e. in groups 341, 341-2 and 341-3 in FIG. 3, through photo-ionization with the UV radiation produced at the cathode backspace, which is common to all the hollow cathodes 341.

Figure 4:
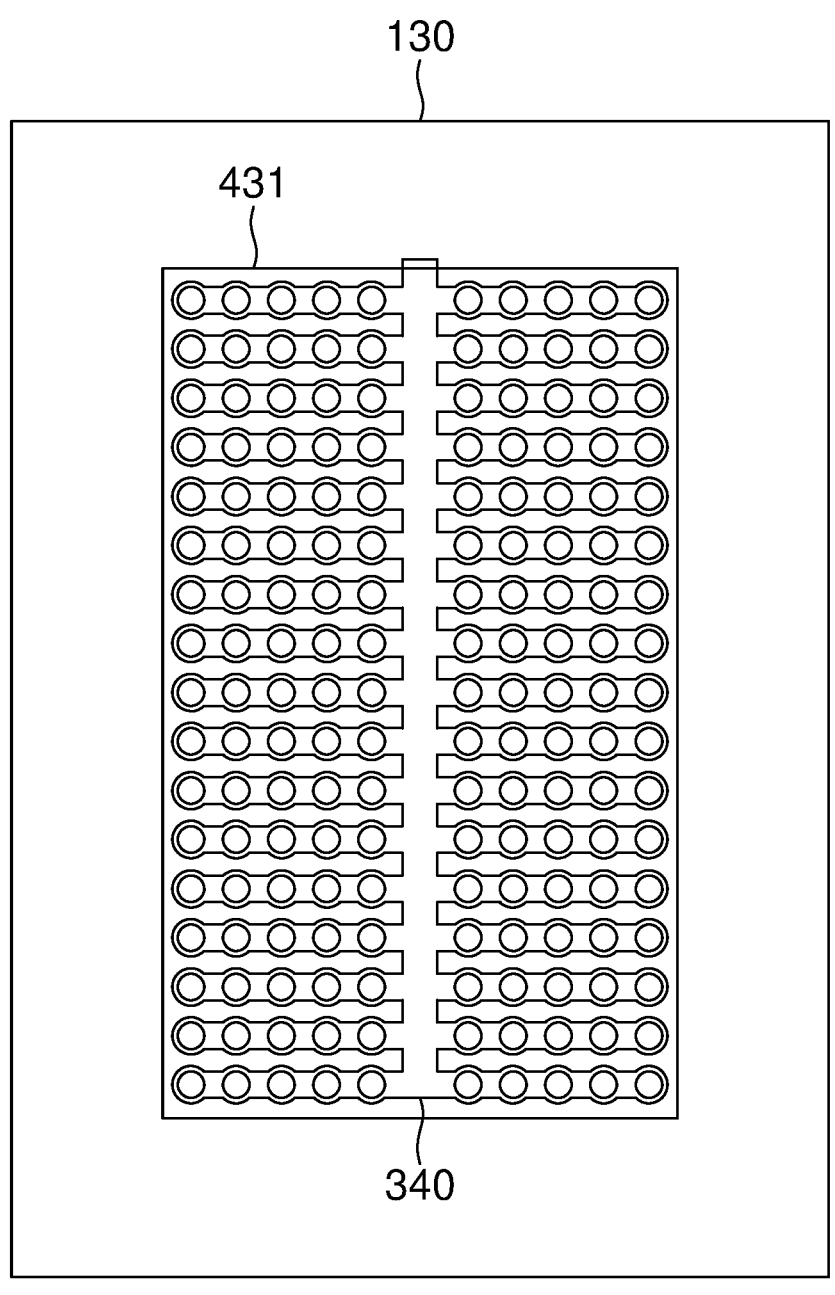
FIG. 4 illustrates a first gas flow plate disposed on the inlet side of the cathode electrode, according to an embodiment of the present invention.

Referring now to FIG. 4, a first gas flow plate disposed on the inlet set of the cathode electrode is illustrated, according to an embodiment of the present invention. The first gas flow plate 130 comprises a rectangular hole 431 which is equal to or larger in size than a length and width of the array of hollow cathodes 340 on the cathode electrode 140, such that when the first gas flow plate 130 is disposed over the cathode electrode 140 as shown in FIG. 4, each of the plurality of hollow cathodes 340 is in fluid communication with the space formed by the rectangular hole 431. As such, gas residing in the space within the rectangular hole 431 may pass through the cathode electrode 140 to the anode-side of the cathode electrode 140 via any one of the plurality of hollow cathodes 340. It will be appreciated that the hole 431 does not necessarily need to be rectangular in shape, and any other shape of hole 431 could be used in other embodiments. The thickness of the first gas flow plate 130 in effect lifts the mixing zone, which is a region in the chamber in which gas streams entering through the plurality of inlets 102 mix with one another before passing through the hollow cathodes 141, away from the surface of the cathode electrode 140. This in turn can lead to better mixing of the inlet gases before passing through the hollow cathodes 141. It will be appreciated that it may not be essential for the gas flow plate 130 to be provided as a physically separate component in order to achieve this function. For example, a similar function may be performed by a cathode electrode 140 having a raised surface around the perimeter of the area in which the hollow cathodes are disposed.

Figure 5:
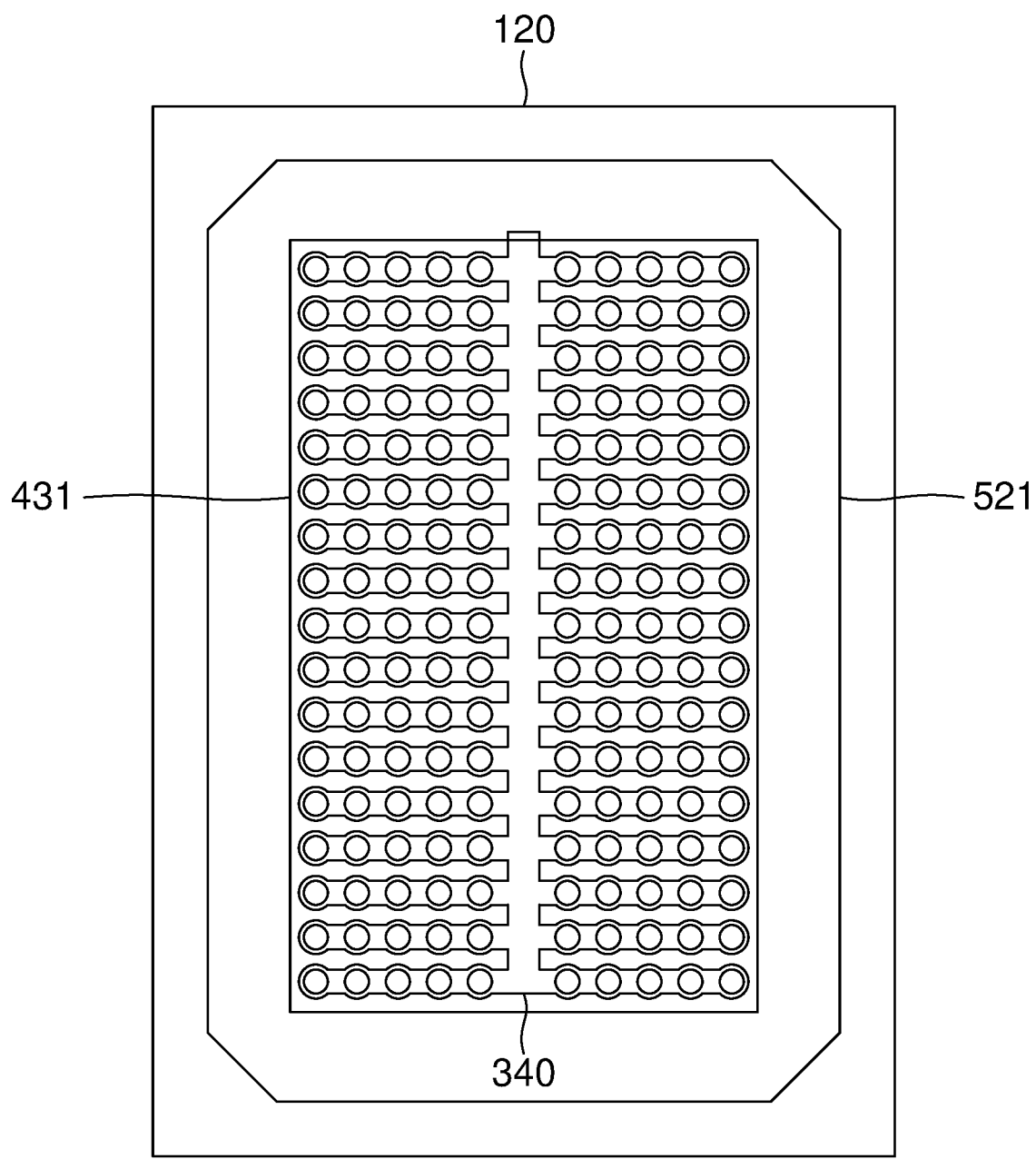
FIG. 5 illustrates a second gas flow plate disposed over the first gas flow plate, according to an embodiment of the present invention.

Referring now to FIG. 5, a second gas flow plate disposed over the first gas flow plate is illustrated, according to an embodiment of the present invention. Like the first gas flow plate 130, the second gas flow plate 120 comprises a hole 521 which is equal to or larger in size than a length and width of the array of hollow cathodes 340 on the cathode electrode 140, such that when the first and second gas flow plates 130, 120 are disposed over the cathode electrode 140 as shown in FIG. 5, each of the plurality of hollow cathodes 340 is in fluid communication with the space formed by the holes 431, 521 in the first and second gas flow plates 130, 120.

In the present embodiment the hole 521 in the second gas flow plate 120 has the shape of an irregular octagon and is larger than the hole 431 in the first gas flow plate 130. However, it will be appreciated that this is merely an example, and in other embodiments the hole 521 in the second gas flow plate 120 could have a different shape and/or different dimensions. Together, the first and second gas flow plates 130, 120 define a space in which gas entering the chamber 101 via the one or more inlets 102 can mix before passing through the hollow cathodes 340.

Figure 6:
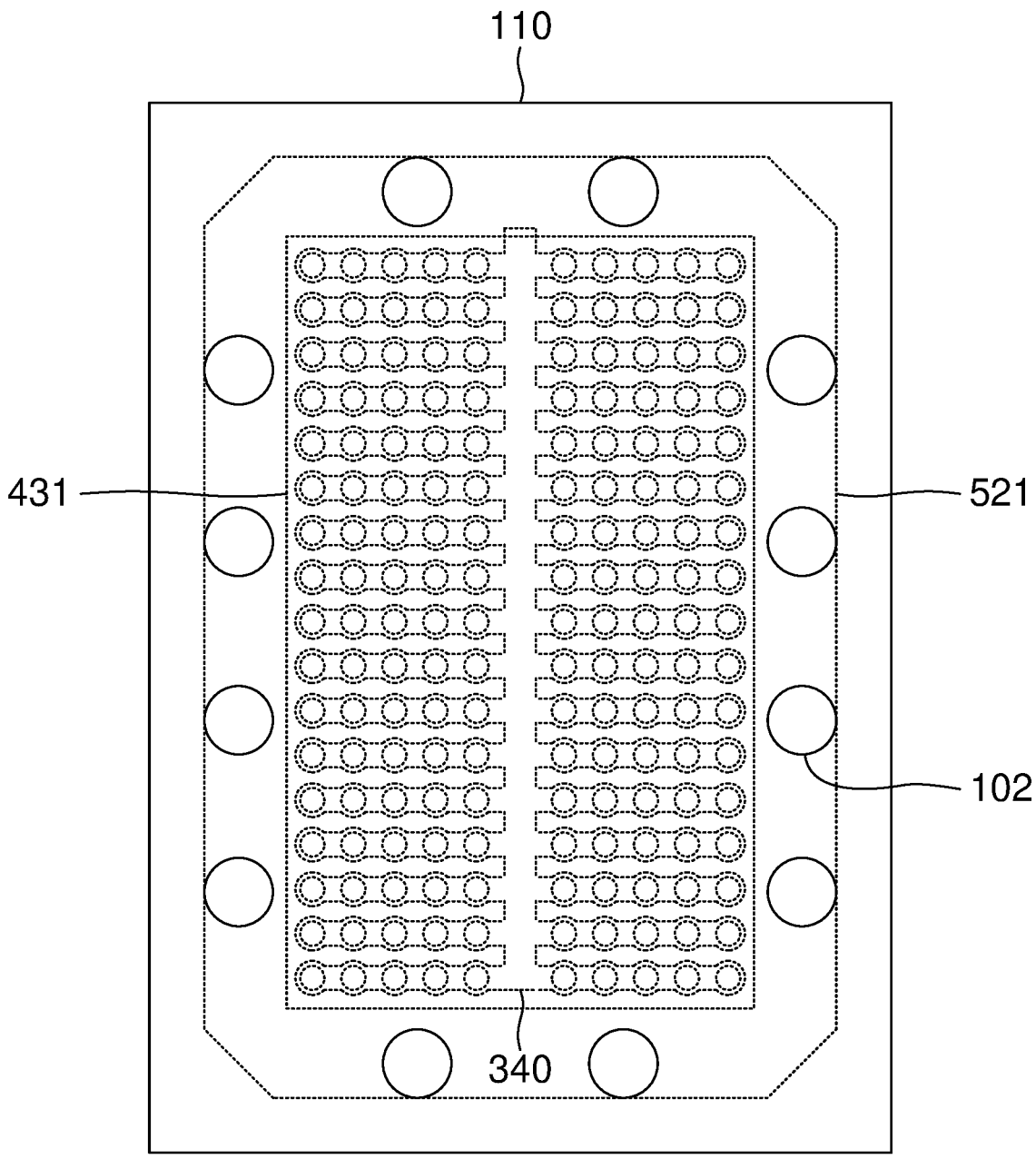
FIG. 6 illustrates an inlet side cover disposed over the second gas flow plate, according to an embodiment of the present invention.

Referring now to FIG. 6, an inlet-side cover disposed over the second gas flow plate is illustrated, according to an embodiment of the present invention. The inlet-side cover 110 comprises a plurality of inlets 102 in fluid communication with the space formed by the holes 431, 521 in the first and second gas flow plates 130, 120, such that the plurality of inlets 102 and the holes 431, 521 define the part of the chamber 101 on the inlet-side of the apparatus 100. The inlet-side cover 110 seals the chamber 101 such that the only route for gas to flow into the chamber 101 is via one of the inlets 102. Although in the present embodiment the first and second gas flow plates 130, 120 and the inlet-side cover 110 are described as separate components, in other embodiments the chamber 101 and inlets 102 could be defined by a suitably-shaped space formed within a single physical component.

Additionally, in the present embodiment the plurality of inlets 101 are disposed outside a perimeter of the region of the cathode electrode 140 in which the hollow cathodes 340 are formed, which may be referred to as the 'hollow cathode region' of the cathode electrode 140. In this way, gas entering the chamber 101 initially impinges on the surface of the first gas flow plate 130 that surrounds the hollow cathode region, deflecting the gas so as to flow laterally across the surface of the cathode electrode 140 and the hollow cathodes 340. This can ensure an even distribution of the inlet gas through the plurality of hollow cathodes 340, such that a similar gas flow rate is achieved through each hollow cathode, as opposed to the flow being concentrated through a small number of the hollow cathodes 340.

Figure 7:
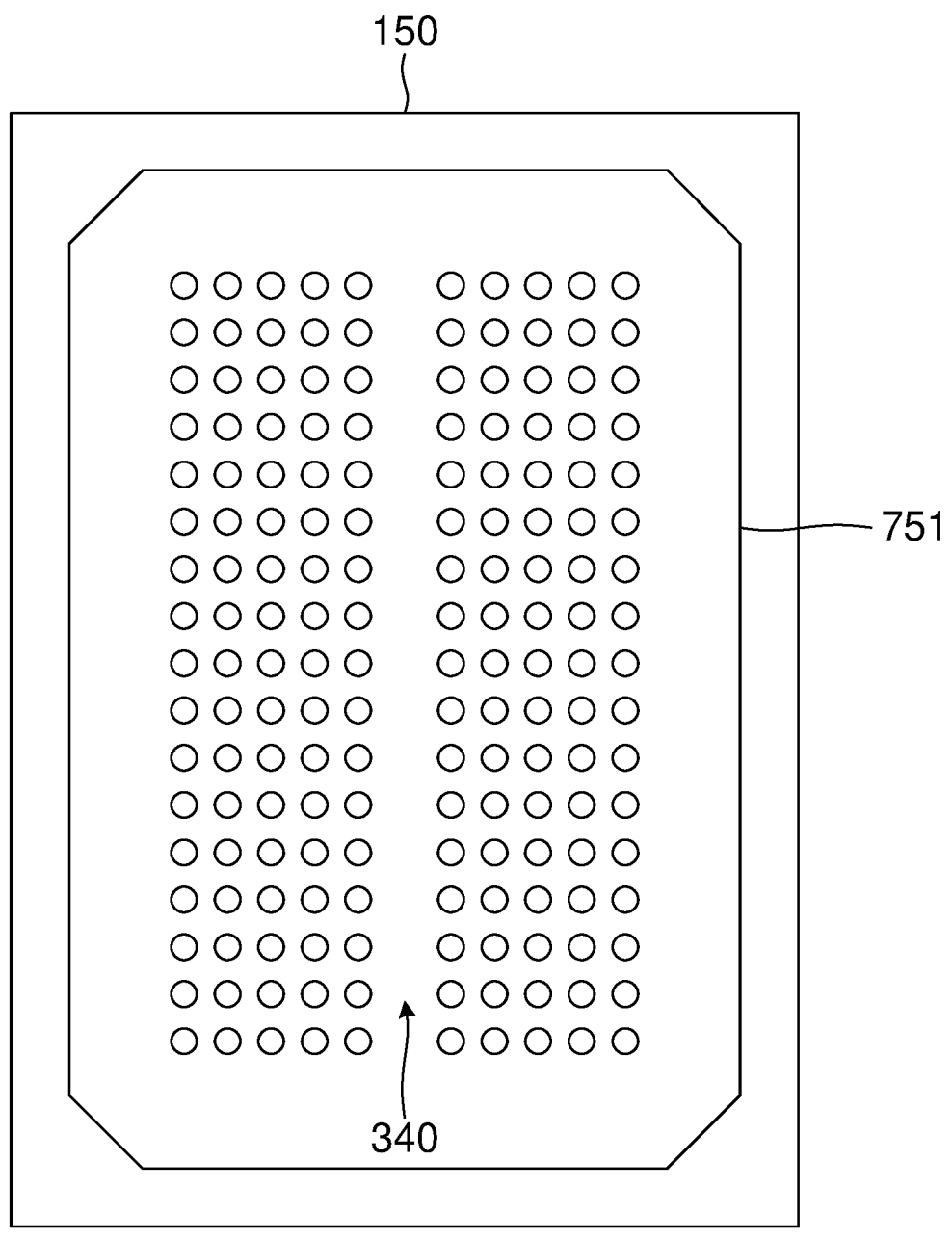
FIG. 7 illustrates a third gas flow plate disposed on the outlet side of the cathode electrode, according to an embodiment of the present invention.

Referring now to FIG. 7, a third gas flow plate disposed on the outlet side of the cathode electrode is illustrated, according to an embodiment of the present invention. In the present embodiment the third gas flow plate 150 is similar in size and shape to the second gas flow plate 120, comprising a hole 751 which is equal to or larger in size than a length and width of the array of hollow cathodes 340 on the cathode electrode 140. Accordingly, when the third gas flow plate 150 is disposed over the cathode electrode 140 as shown in FIG. 7, each of the plurality of hollow cathodes 340 is in fluid communication with the space formed by the rectangular hole 751. As such, gas flowing through the chamber 101 may pass through the cathode electrode 140 and into the space within the rectangular hole 751 via any one of the plurality of hollow cathodes 340. It will be appreciated that the hole 751 does not necessarily need to be rectangular in shape, and any other shape of hole 751 could be used in other embodiments. The thickness of the third gas flow plate 150 affects the A-K gap distance, and may be chosen so as to achieve a desired A-K gap once the apparatus 100 is assembled.

Figure 8:
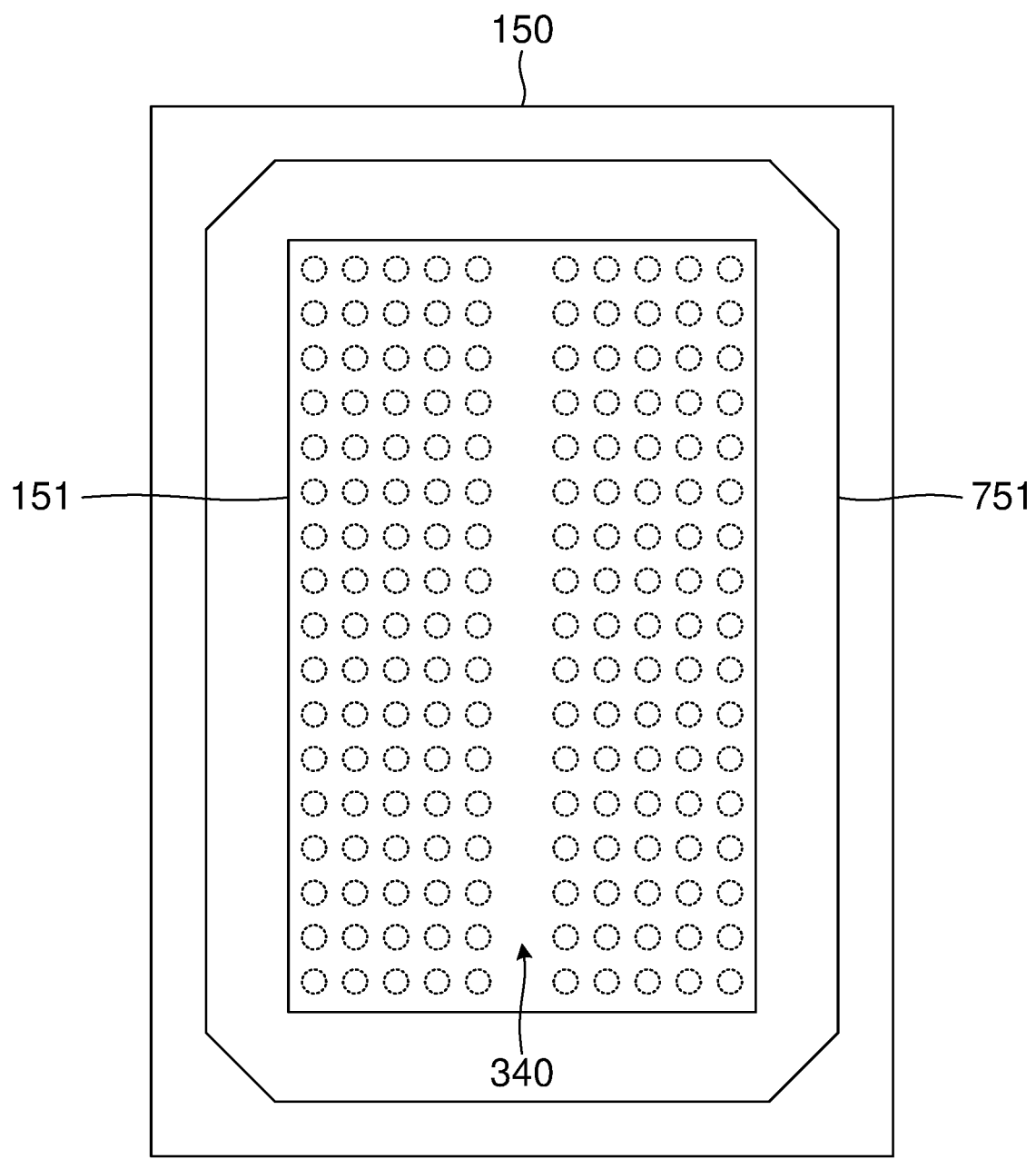
FIG. 8 illustrates an anode electrode disposed facing the outlet side of the cathode electrode, according to an embodiment of the present invention.

Referring now to FIG. 8, an anode electrode disposed facing the outlet side of the cathode electrode is illustrated, according to an embodiment of the present invention. The anode electrode 151 may extend across the whole or part of a face of the cathode electrode 140 opposite the anode electrode 151 once assembled. In the present embodiment, the anode electrode 151 has a size and shape such that once assembled, the anode electrode 151 extends across at least the hollow cathode region of the cathode electrode 140, i.e. the region in which the plurality of hollow cathodes 340 are formed. This ensures that that the electric field strength is uniform across all of the hollow cathodes 340 when a voltage is applied between the cathode electrode 140 and the anode electrode 151.

Additionally, in the present embodiment the anode electrode 151 is formed from an impermeable material, for example metal, such that the anode electrode 151 forms a barrier to gas flow. In this way, gas exiting the hollow cathodes 340 impinges on the surface of the anode electrode 151 and is deflected by the impermeable anode electrode 151 so as to flow laterally across said face of the cathode electrode 140. The advantage of such an arrangement is that gas exiting from one hollow cathode is forced to flow laterally across the surface of the cathode electrode 140 and across the openings of neighbouring ones of the hollow cathodes 340, increasing the time for which gas is exposed to the plasma environment within the apparatus 100 and in turn increasing the treatment effectiveness. However, in other embodiments a permeable anode could be used.

Additionally, when an impermeable anode electrode 151 is used, the separation distance between the anode electrode 151 and the cathode electrode 140 may be set such that a resistance to gas flow laterally in a gap between the anode electrode 151 and the cathode electrode 140 is lower than a resistance to gas flow of the plurality of hollow cathodes 141, for example by choosing suitable thickness of the third gas flow plate 150 and the anode electrode 151. This ensures that the rate of gas flow through the chamber is dependent on the resistance to gas flow of the plurality of hollow cathodes. Arranging the anode-cathode gap to offer a lower resistance to gas flow than the plurality of hollow cathodes 141 in this way will lead to a faster evacuation of the region after the hollow cathodes, effectively allowing the region behind the hollow cathodes (i.e. upstream of the hollow cathodes in the direction of gas flow) to operate at a slightly higher pressure compared with that in the anode-cathode gap. This higher pressure will in turn enhance the ionization growth process in the THCD formation.

Alternatively, in some embodiments the separation distance between the anode electrode and the cathode electrode is set such that the resistance to gas flow laterally in a gap between the anode electrode 151 and the cathode electrode 140 is higher than a resistance to gas flow through the plurality of hollow cathodes 141. In this way, the residence time of the flowing gas in the anode-cathode gap can be increased, which in turn has the effect of enhancing treatment of gas after passing through the hollow cathodes 141 by subjecting gas in the anode-cathode gap to repeated treatment under other adjacent hollow cathodes 141, as the gas flow radially outward away from the hollow cathode through which it first passed.

Figure 9:
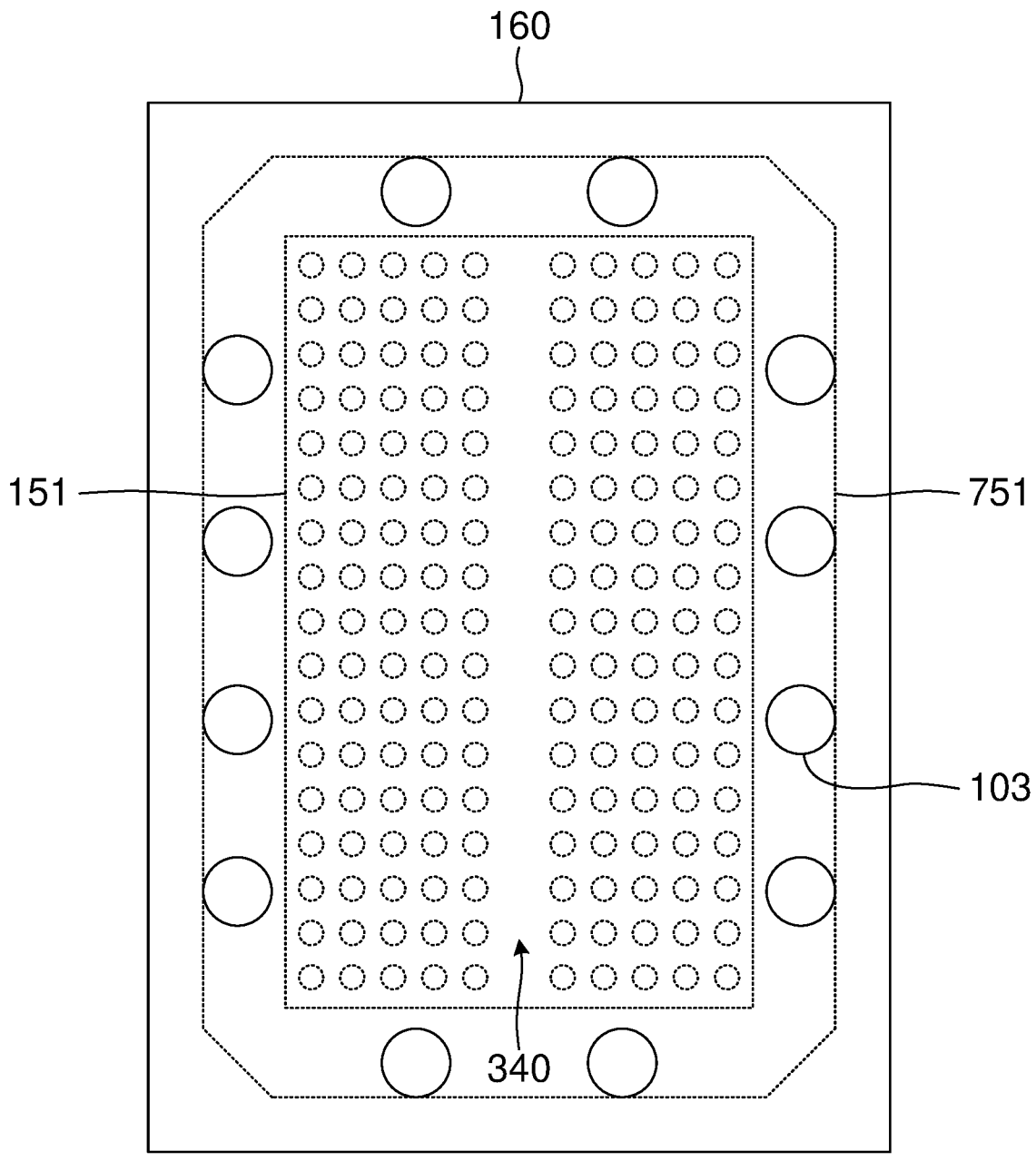
FIG. 9 illustrates an outlet side cover disposed over the third gas flow plate and anode electrode, according to an embodiment of the present invention.

Referring now to FIG. 9, an outlet-side cover disposed over the third gas flow plate and anode electrode is illustrated, according to an embodiment of the present invention. In the present embodiment the outlet-side cover 160 is similar to the inlet-side cover 110, and comprises a plurality of outlets 103 in fluid communication with the space formed by the hole 751 in the third gas flow plate 150. In this way, the plurality of outlets 103 and the hole 751 defines the part of the chamber 101 on the outlet-side of the apparatus 100. The outlet-side cover 160 seals the chamber 101 such that the only route for gas to exit from the chamber 101 is via one of the outlets 103. Although in the present embodiment the third gas flow plate 150 and the outlet-side cover 160 are described as separate components, in other embodiments the chamber 101 and outlets 103 could be defined by a suitably-shaped space formed within a single physical component.

Figures 10, 11:
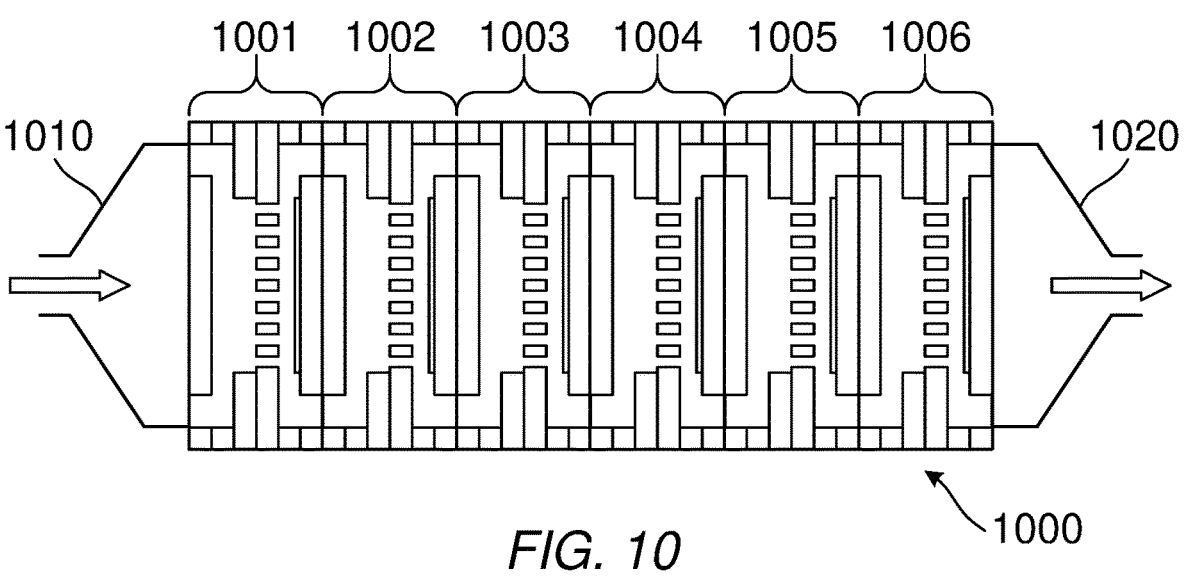
FIG. 10 illustrates a modular apparatus comprising a plurality of plasma reactor modules arranged in series, according to an embodiment of the present invention.
FIG. 11 illustrates a modular apparatus comprising a plurality of plasma reactor modules arranged in parallel and in series, according to an embodiment of the present invention.

Referring now to FIG. 10, a modular apparatus comprising a plurality of plasma reactor modules arranged in series is illustrated, according to an embodiment of the present invention. The modular apparatus 1000 comprises a plurality of plasma reactor modules 1001, 1002, 1003, 1004, 1005, 1006, each comprising a plasma generating apparatus similar to the one described above with reference to FIGS. 1 to 9. The plasma reactor modules 1001, 1002, 1003, 1004, 1005, 1006 are connected in series such that gas exiting the one or more outlets 103 of one of the plasma reactor modules then enters the one or more inlets of the next plasma reactor modules in the series.

Although a series arrangement of six plasma reactor modules 1001, 1002, 1003, 1004, 1005, 1006 is illustrated in the present embodiment, in other embodiments any number of plasma reactor modules, i.e. two or more, may be connected in series. The number of the plasma reactor modules that are connected in series may be selected so as to achieve a desired characteristic of gas exiting the modular apparatus after passing through the number of plasma reactor modules. In embodiments in which the modular apparatus 1000 is used as a source of reaction species products, for example O, O3, OH—, OH radicals, and UV radiation produced by the plasma treatment of a gaseous medium which is principally composed of normal air at atmospheric pressure with the associated component of water vapour, the number of plasma reactor modules to be connected in series may be selected so as to achieve a desired production rate of such reaction species products. Increasing the number of plasma reactor modules will result in the gas spending a longer time within the apparatus exposed to a plasma environment, increasing the rate of generation of such products.

The modular apparatus 1000 comprises an inlet manifold 1010 configured to receive a flow of gas via a common inlet and direct the gas to the one or more inlets 102 of the first plasma reactor module 1001 in the series. The modular apparatus 1000 also comprises an exhaust manifold 1020 configured to receive a flow of gas via the one or more outlets 103 of the last plasma reactor module 1006 in the series. The use of an inlet manifold 1010 may be particularly advantageous in embodiments in which the first plasma reactor module 1001 comprises a plurality of inlets 102, since it may only be necessary to provide a single connection from the inlet manifold 1010 to other equipment located upstream of the modular apparatus 1000. Similarly, the use of an outlet manifold 1020 may be particularly advantageous in embodiments in which the last plasma reactor module 1006 comprises a plurality of outlets 103, since it may only be necessary to provide a single connection from the outlet manifold 1020 to any other equipment located downstream of the modular apparatus 1000. However, in some embodiments one or both of the inlet manifold 1010 and the outlet manifold 1020 may be omitted as required. For example, in some embodiments the outlet manifold 1020 may be omitted so as to effectively expose the outlet-side of the apparatus directly to the outside environment, as will be described in more detail below with reference to FIG. 14.

Referring now to FIG. 11, a modular apparatus comprising a plurality of plasma reactor modules arranged in parallel and in series is illustrated, according to an embodiment of the present invention. The modular apparatus 1100 comprises a plurality of plasma reactor modules connected in parallel so as to define a plurality of gas flow paths 1131, 1132, 1133 through the modular apparatus 1100. In the present embodiment the modular apparatus 1110 comprises a plurality of stages 1101, 1102, 1103, 1104, 1105, 1106, each of which comprises three plasma reactor modules connected in parallel. The number of the plasma reactor modules that are connected in parallel may be selected so as to achieve a desired overall rate of gas flow through the modular apparatus 1100, by reducing the flow resistance for a given plasma reaction rate requirement.

The plurality of stages 1101, 1102, 1103, 1104, 1105, 1106 are themselves connected in series in a similar manner to the apparatus described above with reference to FIG. 10, such that gas exiting one stage then proceeds to the next stage. In some embodiments the modular apparatus 1100 may only comprise a single stage, such that there are no plasma reactor modules connected in series.

As with the modular apparatus of FIG. 10, the modular apparatus 1100 of the present embodiment comprises an inlet manifold 1110 and an outlet manifold 1120. In some embodiments one or both of the inlet manifold 1110 and the outlet manifold 1120 may be omitted as required. Gas entering the modular apparatus 1100 is divided among a plurality of gas flow paths 1131, 1132, 1133, as shown in FIG. 11. Within each stage 1101, 1102, 1103, 1104, 1105, 1106, a portion of said gas flowing along each of the gas flow paths 1131, 1132, 1133 must only pass through a corresponding one of the plasma reactor modules within that stage before exiting the stage. When the modular apparatus comprises other stages connected in series, as shown in FIG. 11, the gas may subsequently pass through plasma reactor modules in other stages before exiting the modular apparatus, but does not pass through other plasma reactor modules in the same stage.

As shown in FIG. 11, the modular apparatus may further comprise a spacer plate 1140 between adjacent plasma reactor modules connected in series. It will be appreciated that similar space plates 1140 could also be provided between the plasma reactor modules 1001, 1002, 1003,

1004, 1005, 1006 in the embodiment of FIG. 10. The space plate is located between the outlet-side cover 160 of one plasma reactor module and the inlet-side cover 110 of the next plasma reactor module in the series. The spacer plate 1140 is configured to electrically shield the cathode electrode 140 in one plasma reactor module from the anode electrode 151 in the previous plasma reactor module in the series. In some embodiments a similar shielding function may be provided by one or both of the respective outlet-side cover 160 and inlet-side cover 110 of the two plasma reactor modules in series, depending on the properties of the materials from which the outlet-side cover 160 and inlet-side cover 110 are formed, in which case a separate spacer plate 1140 may be omitted.

Figure 12:
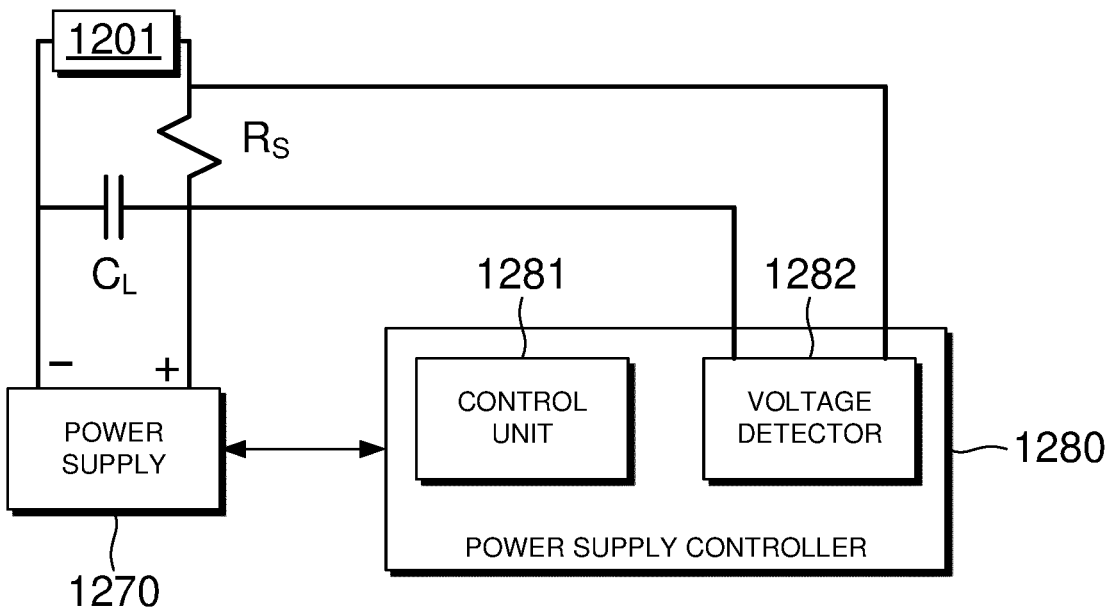
FIG. 12 illustrates a power supply controller according to an embodiment of the present invention.

Referring now to FIG. 12, a power supply controller is illustrated according to an embodiment of the present invention. In this embodiment, the power supply controller is configured to actively monitor the apparatus 100 so as to detect a characteristic indicative of the occurrence of electrical breakdown, as described previously above in relation to FIG. 1. As such, the apparatus comprises means 1282 for detecting the characteristic. In the present embodiment the power supply controller 1280 is configured to monitor the voltage across a current sensing resistor $R_S$, placed between the anode electrode 151 and an intermediate energy store capacitor $C_L$. The voltage across the current sensing resistor $R_S$ is indicative of the current flowing through the apparatus, which will increase suddenly when breakdown occurs and a conducting plasma channel is formed. As such, in this embodiment the means 1282 for detecting the characteristic comprises a voltage detector 1282, which in practice serves to detect the start of the current flow in the plasma created at the onset of electrical breakdown.

The control unit 1281 may monitor a signal from the voltage detector 1282 which is indicative of the voltage measured across the current sensing resistor $R_S$, and may determine that electrical breakdown has occurred when the monitored signal from the voltage detector 1282 indicates an increase in current through the apparatus by more than a threshold amount, and/or when a rate of increase in the current over time exceeds a threshold rate of increase. Although in FIG. 12 the means 1282 for detecting the characteristic is shown as part of the power supply controller 1280, in other embodiments the means 1282 for detecting the characteristic may be physically separate from the power supply controller 1280.

In other embodiments different types of current sensor may be used to detect a change in current flowing from the power supply 1270 to the cathode 140 or the anode 151, for example a Hall effect sensor, and different means for detecting the characteristic may be used as appropriate. As another example, in some embodiments the characteristic may be a change in intensity of electromagnetic radiation generated in the vicinity of the hollow cathode 141 openings or the anode electrode 151, and a suitable form of sensor may be used as the means for detecting the characteristic, such as an optical sensor.

Also illustrated in FIG. 12 is a capacitor $C_L$ connected in parallel with the plasma reactor 1201 across the positive and negative terminals of the power supply 1270. The capacitor $C_L$ provides an energy limiting storage function that can help to (a) achieve a fast rise-time applied voltage, (b) provide a voltage gain due to the peaking action of the capacitor, and (c) limit the energy that is available to the plasma once it is formed while the level of the supplied power is reduced.

Figure 13:
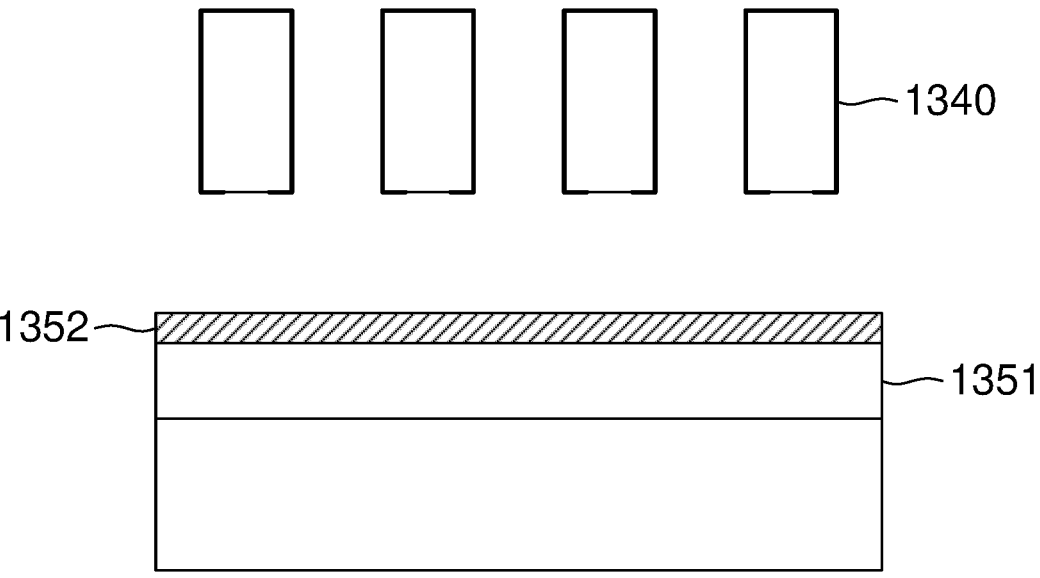
FIG. 13 illustrates apparatus comprising an electrically insulating layer disposed between the anode electrode and the cathode electrode, according to an embodiment of the present invention.

Referring now to FIG. 13, apparatus comprising an electrically insulating layer disposed between the anode electrode and the cathode electrode is illustrated, according to an embodiment of the present invention. The electrically insulating layer 1352, which may be a semi-insulating layer in some embodiments, is disposed between the anode electrode 1351 and the cathode electrode 1340, so as to limit an amount of energy delivered to the plasma after electrical breakdown has occurred. For example, the electrically insulating layer 1352 may comprise an insulating or high-resistivity semi-conducting thin film.

The effect of the electrically insulating layer 1352 is to create a configuration similar to a dielectric barrier discharge (DBD), limiting the energy that is delivered to the conducting plasma after it has formed. However, unlike conventional DBD in which the discharge takes the form of a dense plasma spike randomly distributed over a large surface, when used in embodiments of the present invention the electrically insulating layer 1352 on the anode electrode 1351 creates a diffused plasma channel at specific location through which the gaseous medium flows, as a result of the transient hollow cathode discharge formation process. In comparison to a conventional DBD reactor system, an embodiment such as the one illustrated in FIG. 13 can use a smaller reactor volume and hence achieve a more compact apparatus, for any give treatment efficiency per unit of reactor volume.

Referring now to FIG. 14, an apparatus for generating a plasma in which gas enters the apparatus on the same side as the anode electrode is illustrated in cross-section, according to an embodiment of the present invention. The apparatus is similar in some respects to the apparatus of FIG. 1, comprising an inlet-side cover 1410, first gas flow plate 1420, cathode electrode 1440, and second gas flow plate 1450. The inlet-side cover 1410 may be similar in form to the inlet-side cover 110 described above with reference to FIGS. 1 and 6, while the first gas flow plate 1420 may be similar in form to the second gas flow plate 120 described above with reference to FIGS. 1 and 5. The second gas flow plate 1450 of the present embodiment may be similar in form to the second gas flow plate 130 described above with reference to FIGS. 1 and 4. However, it should be understood that the physical form and manner of construction of the apparatus shown in FIG. 14 is not limiting, and in other embodiments an apparatus with the anode electrode 1451 disposed on the same side of the cathode electrode 1440 as one or more gas inlets 1402 may have a different form to the one shown in FIG. 14.

As shown by the dashed arrows in FIG. 14, which indicate the direction of gas flow through the apparatus during use, gas enters the apparatus through one or more inlets 1402 and then flows laterally through a gap between the anode electrode 1451 and cathode electrode 1440, which may be referred to as the anode-cathode gap or "A-K gap", before passing through the cathode electrode 1440 via the plurality of hollow cathodes 1441. Since the anode electrode 1451 is disposed on the same side of the cathode electrode 1440 as the gas inlets, the outlet-side of the apparatus can be effectively open to outside world. An apparatus such as the one shown in FIG. 14 may still operate at atmospheric pressure, or at low vacuum pressures.

This arrangement can allow the apparatus to be used to provide an ion-rich plasma cloud that is capable of spreading over a large surface area. Such a configuration can be advantageous in various applications, including but not limited to surface treatment of substrates 1490 such as a plastic surface 1490 for printing. Plasma treatment of plastic surfaces can be used to improve whetting, in turn enhancing the effectiveness of a printing process by helping ink to adhere more strongly to the plasma-treated surface. Plasma treatment using an apparatus such as the one shown in FIG. 14 may also be used to impart desirable properties to the substrate 1490 by appropriate selection of material, gas and process conditions, for example to render the surface of the substrate 1490 hydrophobic or hydrophilic properties.

In some embodiments, a modular surface treatment apparatus may be constructed by connecting a plurality of plasma reactor modules similar to the one shown in FIG. 14 in parallel, in terms of the gas flow path through the apparatus. The plasma reactor modules may be arranged across a large area so as to provide simultaneous plasma treatment of a large surface area of the substrate 1490, which may be particularly advantageous in high-throughput industrial applications such as reel-to-reel processing of plastic sheets or other forms of substrates 1490.

Furthermore, in some embodiments an apparatus similar to the one shown in FIG. 14 can be used to provide a large surface ion-rich plasma, from which ions can be extracted to create a large surface ion beam. Used in this way, the apparatus effectively behaves like a surface with very low work function. In such embodiments, the gas supplied to the one or more inlets 1402 may be chosen according to the ionic species that are desired to be generated on the outlet-side of the apparatus. Yet another potential application of an apparatus such as the one shown in FIG. 14 may be high pressure etching or ashing of the substrate 1490, for example to strip a photo-resist layer from an optical lithography substrate.

Referring now to FIG. 15, a circuit for supplying electrical power to apparatus for generating a plasma is illustrated, according to an embodiment of the present invention. The circuit comprises a power supply 1570 for supplying electrical power to the apparatus. A cathode electrode 1541 of the apparatus is connected to the negative terminal of the power supply 1570, whilst the anode electrode 1551 of the apparatus is connected to the positive terminal of the power supply 1570. A capacitor $C_L$, which may be referred to as an intermediate energy store capacitor, is connected in parallel with the apparatus, as described above with reference to FIG. 12. Also, a ballast 1590 comprising an inductor L in series with a resistor R is connected in series between the cathode electrode 1541 and the power supply 1570. The ballast 1590 serves to limit the amount of energy supplied to the conducting plasma by the power supply 1570 once the plasma has been formed. Also, by connecting one terminal of the capacitor $C_L$ between the ballast 1590 and the cathode electrode 1541, the amount of energy that is delivered to the plasma after electrical breakdown is to a large extent restricted to the energy that is stored in the capacitor $C_L$. In this way, the combination of the ballast 1590 and capacitor $C_L$ acts to restrict the supply of power to the apparatus once electrical breakdown has occurred, avoiding excessive energy consumption that would otherwise occur due to Joule heating of the plasma.

As shown in FIG. 15, in the present embodiment the power supply 1570 comprises a first switch $S_1$ and a second switch $S_2$ connected in series between a high voltage power supply and the positive terminal, and comprises a main capacitor C connected in parallel with the high voltage power supply and the output positive and negative terminals. Also, one side of the main capacitor C is connected to a node between the first switch $S_1$ and the second switch $S_2$. A power supply 1570 such as the one described here may be used in any of the above-described embodiments.

The operation of the power supply 1570 is as follows. At a time $t=t_0$, the power supply controller closes the first switch $S_1$ and the main capacitor C is charged to the desired voltage. Once the main capacitor C is charged, the power supply controller opens the first switch $S_1$ and closes the second switch $S_2$. This transfers the energy in the main capacitor C to the intermediate energy store capacitor $C_L$. In the present embodiment the intermediate energy store capacitor $C_L$ has a capacitance less than or equal to a half that of the main capacitor C, such that C and $C_L$ form a ringing circuit through which energy is transferred to the cathode electrode 1541 and anode electrode 1551, resulting in a higher voltage impressed across $C_L$. The rise time of this voltage, and the waveform, can be tailored through a suitable choice of the inductance L and resistance R values of the ballast 1590. The value of R may be chosen such that the LCR ringing circuit is slightly under-damped.

This voltage across $C_L$ is directly presented to the anode electrode 1551 and cathode electrode 1541, and starts the THCD process. Then at a later time $t > t_0$, when electrical breakdown occurs and the start of a conducting plasma is established and detected, the power supply controller opens the second switch $S_2$, isolating the intermediate energy store capacitor $C_L$ and the cathode and anode electrodes 1541, 1551. At this point, only the energy that is stored in the intermediate energy store capacitor $C_L$ is available to plasma, thereby limiting the extent to which the plasma is heated and in turn reducing the energy consumption of the apparatus.

As described above, in some embodiments the power supply controller may reduce the power level to a lower level once electrical breakdown has occurred, rather than stopping the supply of electrical power completely. For example, this may be desirable in some situations to avoid a large back emf that would otherwise occur when the second switch $S_2$ is opened fully. In such embodiments, the power supply 1570 may include a resistor that can be switchably connected across $S_2$ before it is opened, so as to provide a significantly lower power level to the cathode and anode electrodes 1541, 1551 without opening the second switch $S_2$. The second switch $S_2$ may then be opened fully a certain time later.

Referring now to FIGS. 16 and 17, alternative forms of hollow cathodes to the one shown in FIG. 2 are illustrated, according to embodiments of the present invention. In the embodiment of FIG. 16, a hollow cathode in the cathode electrode 1640 comprises a conductive surface 1641*a* on the inlet-side of the cathode electrode 1640, with an inner conductive surface 1641*b* which extends part of the way through the hollow cathode and stops short of the anode-side end of the through hole. In the embodiment of FIG. 17, a hollow cathode in the cathode electrode 1740 comprises a conductive surface 1741*a* on the inlet-side of the cathode electrode 1640, without any conductive surface on the inside of the through-hole. All of the hollow cathodes illustrated in FIGS. 2, 16 and 17 are capable of supporting the transient hollow cathode discharge effect, and may be used in any of the above-described apparatuses for generating plasma via the transient hollow cathode discharge effect.

In the embodiments described above, the inlet and outlet are disposed on opposite sides of the cathode electrode such that gas enters the apparatus on one side of the cathode electrode, passes through the hollow cathodes, and then exits the apparatus on the opposite side of the cathode electrode. For example in the embodiment of FIG. 1, the apparatus 100 is configured so as to define a gas flow pathway passing from the one or more inlets 102 to the one or more outlets 103 through the plurality of hollow cathode through-thickness holes 141. In this way, gas flowing through the apparatus passes through the hollow cathode through-thickness holes 141 and is exposed to the plasma generated therein. In the embodiment of FIG. 1 this is achieved by having the one or more inlets 102 disposed on the opposite side of the cathode electrode 140 to the one or more outlets 103.

Figure 18:
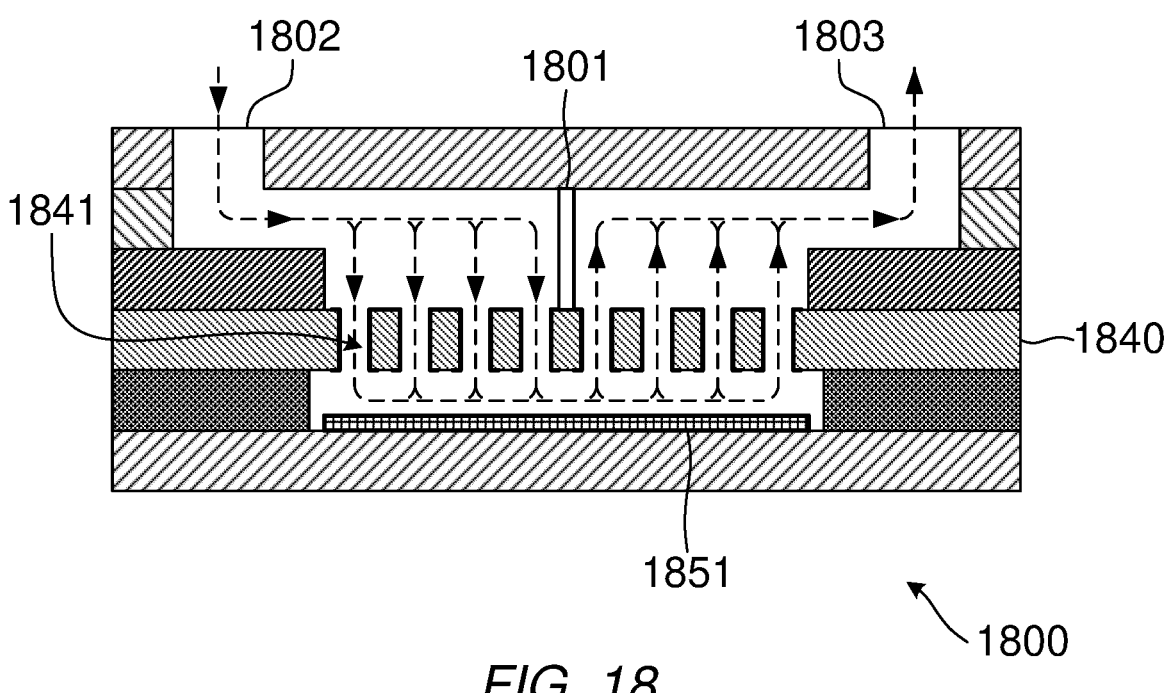
FIG. 18 illustrates a cross-sectional view through an apparatus for generating a plasma in which the inlet and outlet are disposed on the same side of the cathode electrode, according to an embodiment of the present invention.

However, in other embodiments the one or more inlets 102 and the one or more outlets 103 may be disposed on the same side of the cathode electrode 140, for example as illustrated in FIG. 18. In the embodiment of FIG. 18, the apparatus 1800 comprises a gas flow barrier 1801 such as a solid partition or baffle disposed in the chamber on the opposite side of the cathode 1840 to the anode 1851, so as to cause all or part of the gas entering the chamber via the one or more inlets 1802 to flow through hollow cathodes 1841 on the inlet side of the gas flow barrier 1801 to the anode side of the cathode electrode 1840, and then flow back in the opposite direction through hollow cathodes 1841 on the outlet side of the gas flow barrier 1801 to reach the one or more outlets 1803. In this way, the one or more inlets 1802 and outlets 1803 may be disposed on the same side of the apparatus 1800, allowing the total height of the apparatus 1800 to be reduced.

Figure 19:
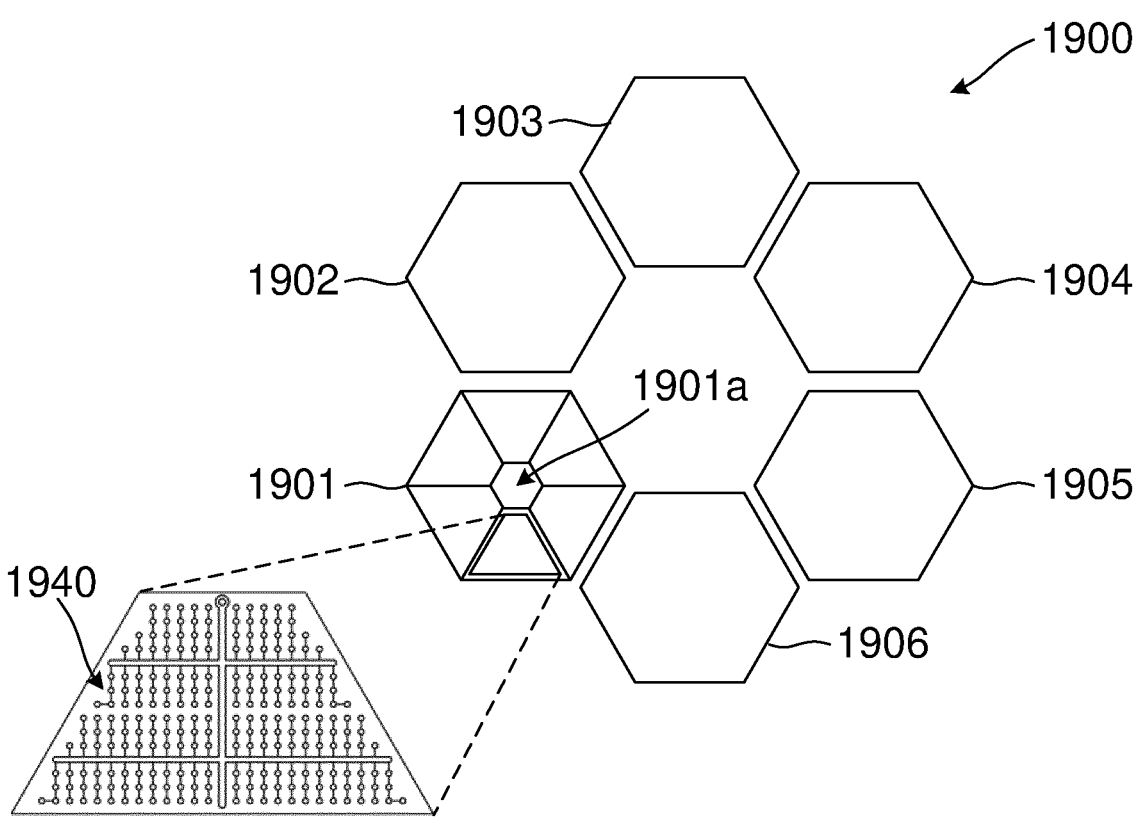
FIG. 19 illustrates a modular apparatus comprising a plurality of plasma reactor modules arranged in parallel, according to an embodiment of the present invention.

Referring now to FIG. 19, a modular apparatus comprising a plurality of plasma reactor modules arranged in parallel is illustrated, according to an embodiment of the present invention. The modular apparatus 1900 comprises six plasma reactor modules 1901, 1902, 1903, 1904, 1905, 1906 connected in parallel so as to define a plurality of gas flow paths through the modular apparatus 1900, in a similar manner to that of the apparatus described above in relation to FIG. 11. The plasma reactor modules 1901, 1902, 1903, 1904, 1905, 1906 are illustrated as viewed from above, looking down on the plurality of hollow cathodes 1940 within each module 1901, 1902, 1903, 1904, 1905, 1906.

Although only six plasma reactor modules 1901, 1902, 1903, 1904, 1905, 1906 are shown in FIG. 19, the module apparatus 1900 may further comprise one or more similar arrangements of other plasma reactor modules stacked in a direction perpendicular to the plane of the paper in FIG. 19, in other words, above or below the six plasma reactor modules 1901, 1902, 1903, 1904, 1905, 1906 shown in FIG. 19 so as to form a vertical stack of plasma reactor modules. In such embodiments, each additional layer of plasma reactor modules above or below the six plasma reactor modules 1901, 1902, 1903, 1904, 1905, 1906 may be connected in series to the layer(s) on either side, such that the modular apparatus then comprises a plurality of plasma reactor modules connected both in series and in parallel, in a similar manner to the apparatus shown in FIG. 11.

The exploded view in the bottom left-hand corner of FIG. 19 illustrates one half of a trapezoidal arrangement of hollow cathodes 1940 within a first one of the plasma reactor modules 1901. The trapezoidal arrangement of hollow cathodes 1940 may be referred to as a hollow cathode sub-assembly. It will be appreciated that the right-hand side of the trapezoid illustrated in the exploded view will include a similar arrangement of hollow cathodes 1940 to those shown on the left-hand side, but that only one half is illustrated for clarity. Similarly, it will be appreciated that the other five trapezoidal sections of the first plasma reactor module 1901 will include a similar arrangement of hollow cathodes 1940 to that shown in the exploded view, rotated as appropriate. The second to sixth plasma reactor modules 1902, 1903, 1904, 1905, 1906 may all have a similar arrangement of hollow cathodes to that of the first plasma reactor module 1901, but again, only the structure of one of the modules is shown in detail in FIG. 19 for purposes of clarity.

In comparison to the embodiment described above with reference to FIGS. 3 to 9, the actual cell of each plasma reactor module 1901, 1902, 1903, 1904, 1905, 1906 in the present embodiment is in the form of a trapezoid, which permit the construction of a plasma reactor module that is hexagonal in cross-section. The area outside the hexagonal plasma reactor modules 1901, 1902, 1903, 1904, 1905, 1906 represents a structure to which a circuit board, or other suitable substrate, housing the hollow cathode electrodes is attached. The anode unit of each plasma reactor module 1901, 1902, 1903, 1904, 1905, 1906 is similar in dimension to the hollow cathode unit shown for the first plasma reactor module 1901, except that fluid communicating holes to provide gas flow paths will be located around the anode electrode unit to allow gas to flow through to the next layer in the stack.

This packing arrangement of hollow cathodes 1940 provides an advantage over the rectangular design shown in FIG. 3. In particular, the trapezoidal form factor leaves space for a central passage 1901a to be created when a group of six rotated trapezoids are arranged in hexagonal form, as shown for the first plasma rector module 1901. This central aperture can house a negative power line configured to supply the negative high voltage pulse to each of the six hollow cathode sub-assemblies 1940 within the plasma reactor module 1901. The six hollow cathode sub-assemblies 1940 can be connected to a common ground return located on the outside edge of the plasma reactor module 1901. This gives a coaxial configuration which can help to minimize electromagnetic radiation arising from the high voltage drive pulse, particularly during the breakdown phase of the transient hollow cathode discharge.

A further advantage compared to the rectangular arrangement shown in FIG. 3 is that the placement of six separate hollow cathode sub-assemblies parallel in this hexagonal form ensures that a failure of a particular sub-assembly only has a minimal effect on the performance of each hexagonal layer, i.e. on the performance of the plasma reactor module 1901 as a whole.

Yet a further advantage is that the close packing of six hollow cathode assemblies with a central high voltage drive pulse feed allows more efficient utilization of space in the complete modular apparatus, reducing the overall size of the apparatus for a given level of performance. This is possible because it is no longer necessary to provide high voltage isolation between different hexagonal plasma reactor modules 1901, 1902, 1903, 1904, 1905, 1906, if the external surface of each plasma reactor module 1901, 1902, 1903, 1904, 1905, 1906 is used as a common ground return.

Figure 20:
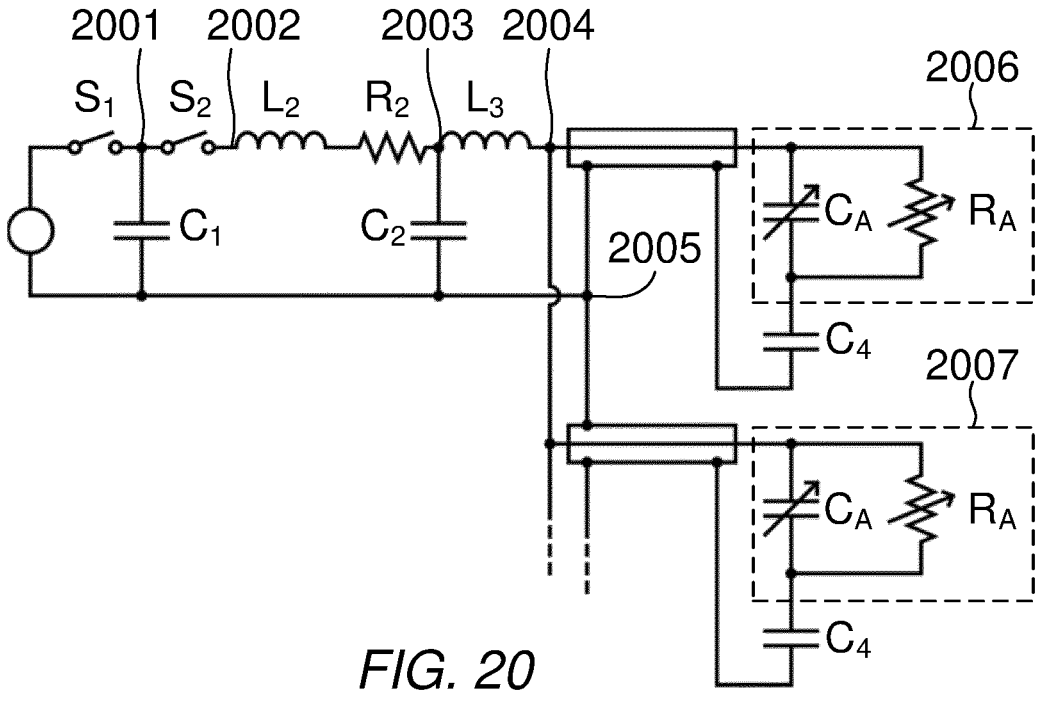
FIG. 20 is a circuit diagram illustrating connections between components that make up a capacitive drive circuit configured to provide pulses of power to a plurality of plasma reactor modules, according to an embodiment of the present invention.
Figure 21:
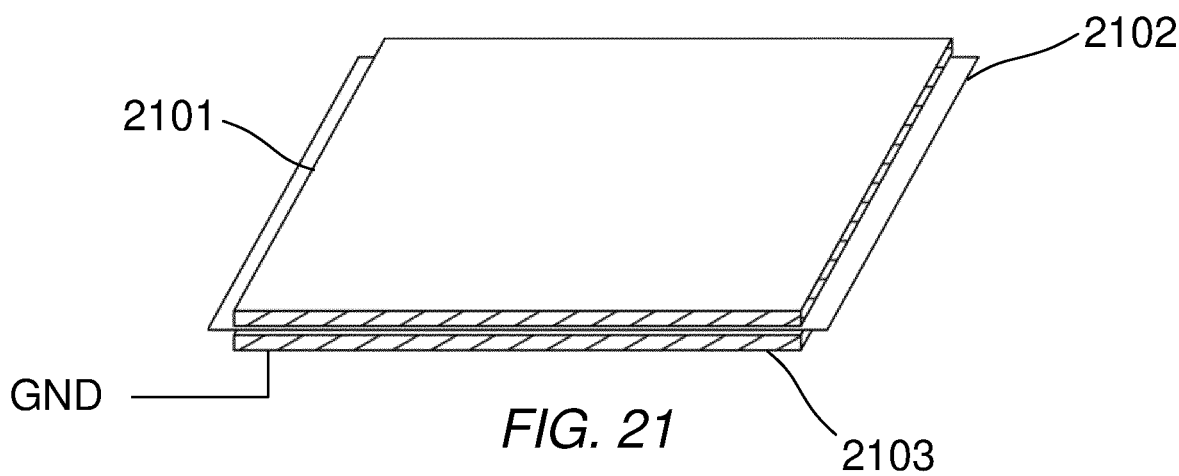
FIG. 21 is a perspective view of an anode structure that can be used in each plasma reactor module with the capacitive drive circuit of FIG. 20, according to an embodiment of the present invention.
Figure 22:
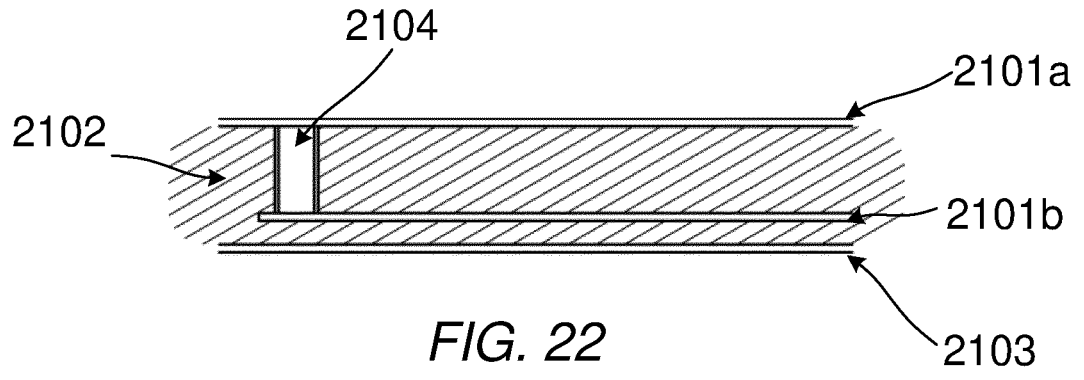
FIG. 22 is a cross-sectional view through the anode structure shown in FIG. 21, according to an embodiment of the present invention.

Referring now to FIGS. 20 to 22, a capacitive drive circuit configured to provide pulses of power to a plurality of plasma reactor modules is illustrated, according to an embodiment of the present invention. FIG. 20 is a circuit diagram illustrating connections between components that make up the capacitive drive circuit, while FIG. 21 is a perspective view of an anode structure that can be used in each plasma reactor module, and FIG. 22 is a cross-sectional view through the anode structure shown in FIG. 21. A drive circuit such as the one shown in FIG. 20, and/or an anode structure such as the one shown in FIGS. 21 and 22, may be used with the plasma generating apparatus of any of the above-described embodiments.

The capacitive drive circuit comprises a voltage source (V), first and second switches $S_1$, $S_2$, first and second inductors $L_2$, $L_3$, and first and second capacitors $C_1$, $C_2$. An output side of the drive circuit is connected in parallel to the anode (A) and cathode (K) structures of each one of a plurality of plasma reactor modules (APR) 2006, 2007. In FIG. 20, each APR 2006, 2007 is represented by a time varying capacitor $C_A$ and a time varying resistor $R_A$, connected in parallel. The drive circuit may provide power to any number of APRs, as shown by the use of dashed lines in the lower part of FIG. 20.

The first switch $S_1$ is connected between a high voltage side of the voltage source and a first node 2001. The second switch $S_2$ is connected between the first node 2001 and a second node 2002, the first inductor $L_2$ is connected between the second node 2002 and a third node 2003 via a resistor $R_2$, and the second inductor $L_3$ is connected between the third node 2003 and a common high voltage output 2004. The cathodes of each of the plurality of APRs are connected to the common high voltage output via their respective integrated isolating capacitors $C_4$, and via one or more transmission lines as shown in FIG. 20. The first capacitor $C_1$ is connected between the first node 2001 and a low voltage side of the voltage source, whilst the second capacitor $C_2$ is connected between the third node 2003 and the low voltage side of the voltage source. The low voltage side of the voltage source is also connected to a common ground 2005, to which the anodes of each of the plurality of APRs 2006, 2007 are connected via the respective transmission lines.

The anode structure illustrated in FIGS. 21 and 22 includes an integrated isolating capacitor, $C_4$, which has a relatively high capacitance compared to other capacitors in the drive circuit. The anode structure 2101 comprises a top electrode of the anode in the form of a first conductive layer 2101a, and an intermediate electrode of the anode in the form of a second conductive layer 2101b. The first and second conductive layers 2101a, 210b are separated by an insulating dielectric 2102, and are connected via a conducting pathway, which in the present embodiment is provided as a via 2104. The top electrode and the intermediate electrode together act as the anode in the plasma reactor module. The anode structure further comprises a bottom electrode 2103 in the form of a third conductive layer, separated from the second conductive layer 2101b by the insulating dielectric 2102. The second and third conductive layers 2101b, 2103 together act as the integrated isolating capacitor, $C_4$.

The operation of the drive circuit over time can be divided into three distinct periods, as follows:

(1) The first application of high voltage across the A-K gap, when ionization growth under the hollow cathode configuration takes place.

(2) The transition to the hollow cathode discharge phase when sufficient ionization has been established across the A-K gap, and a conducting plasma begins to form.

(3) The continuation of plasma formation due to current flow, the conversion of the locally stored electrostatic energy to the energy in the plasma formed, being dissipated in plasma heating and radiation, leading to the end of high current drive phase.

The operation of the drive circuit as a whole, including the function of the isolating capacitor $C_4$, will now be described in more detail below. It will be appreciated that the operation of the various switches may be controlled by a suitable controller configured to generate the necessary control signals to open or close each switch at the appropriate time:

1. A current drive cycle starts with switch $S_2$ opening and $S_1$ closing, the effect of which is to charge capacitor $C_1$ to a given high voltage.

2. When capacitor $C_1$ is charged, switch $S_1$ is opened to isolate it from the voltage source, and $S_2$ closes to transfer the charge in $C_1$ to $C_2$, through a resonant circuit defined by $L_2$, with $R_2$ providing the required damping factor. $C_2$ is arranged to be lower in capacitance then $C_1$, thus allowing a 'ring up' gain (i.e. an increase in voltage initially stored in $C_1$).

3. This process of charging $C_2$ will also allow the combination of $C_4$ and $C_A$ to be charged through the isolation inductance $L_3$, and the transmission line. For time duration long compared with the transit time through the transmission line, the transmission line acts as both an inductance in series and a capacitance in parallel, with the combination ($C_4$+$C_A$ in series).

4. As $C_4$ is much greater than $C_A$ (e.g. approximately 100 times greater), most of the voltage established across $C_2$ will appear across $C_A$.

5. The high voltage across the A-K electrodes initiates the ionization growth process to begin within the hollow cathode geometry, ultimately leading to the creation of a virtual anode moving from the physical anode surface towards the hollow cathode, as has been described above.

6. This decrease in distance between the virtual anode and the cathode surface increases the effective capacitance across the A-K gap and thus electrostatic energy stored in $C_A$.

7. When the virtual anode penetrates beyond the hollow cathode aperture, charge multiplication increases rapidly and a dilute plasma is formed, leading to the beginning of substantial current flow. The characteristics of the plasma across the A-K gap takes on a resistive nature.

8. With continuous current flow established, the plasma resistance decreases rapidly, supported by the electrostatic energy that has initially been stored across the A-K gap.

9. As the plasma resistance decreases, the current flow increases, since there is practically no inductive component to limit the rate of rise of current (a simple RC discharge circuit). The increasing current flow leads to further heating of the plasma, and thus a decrease in plasma resistance, which in turn leads to further increase of current flow. This positive feedback process (negative resistance) continues to create rapidly a highly ionized plasma, until the electrostatic energy initially stored across the A-K gap is totally consumed.

10. The processes described in points 7-9 above take place in the nanosecond (ns) time scale, while the processes in points 2-3 take place in the time scale of hundreds of ns.

11. As the local energy stored across the A-K gap is consumed, the drive current across the discharge decreases to a value defined by the charging current of $C_4$ through $L_3$ and the transmission line. This current is substantially lower than the high drive current during the hollow cathode discharge phase. The plasma begins to cool and recombination processes set in to return the plasma to a high resistivity state. This highly resistive plasma diminishes the charging current through $C_4$, which further accelerates the cooling of the plasma. This point in time can be considered as representing the termination of the drive current.

12. By suitably choosing the value of the circuit components, particularly the value of the $C_2$, $C_4$ and the transmission line length, as well as the A-K gap capacitance, the termination of the high current drive can be controlled so as to occur at a desired point in time after the formation of the highly conducting plasma created by the hollow cathode discharge process.

13. The introduction of $C_4$ effectively provides an isolation element in the plasma discharge process.

14. In the case of a short circuit occurring across the A-K gap, for example due to a mechanical and/or electrical fault, the equivalent circuit of this short circuit is a low value resistance and the current through the short circuit is now defined by the charging current flowing through $C_4$. By having $C_4$>>$C_2$, this fault current can be limited to a low value, and effectively isolating the faulty module with a short circuit from the rest of the modules connected in parallel. This yields a self-isolating, fault-tolerant design for an apparatus comprising a plurality of plasma reactor modules (APRs), such as the modular apparatuses described above.

Furthermore, in some embodiments a capacitive drive circuit such as the one shown in FIG. 20 may be used to supply power to other types of apparatus other than an APR. Similarly, in some embodiments the anode comprising the integrated isolating capacitor as illustrated in FIGS. 21 and 22 may be used in other apparatus than an APR, and accordingly is not limited to use as the anode electrode in an APR.

Whilst certain embodiments of the invention have been described herein with reference to the drawings, it will be understood that many variations and modifications will be possible without departing from the scope of the invention as defined in the accompanying claims.

The invention claimed is:

1. Apparatus for generating a plasma via the transient hollow cathode discharge effect, the apparatus comprising:
a chamber comprising an inlet configured to allow a gas to enter the chamber and an outlet configured to allow the gas to exit the chamber;
a cathode electrode disposed in the chamber, the cathode electrode comprising a plurality of hollow cathodes each comprising a through-thickness hole through configured to allow the gas pass from one side of the cathode electrode to another side of the cathode electrode, wherein the apparatus is configured so as to define a gas flow pathway passing from the inlet to the outlet through the plurality of hollow cathode through-thickness holes;
an anode electrode spaced apart from the cathode;
a power supply electrically connected to the anode electrode and the cathode electrode for supplying electrical power to generate a plasma at the plurality of hollow cathodes; and
a power supply controller configured to reduce a power level of the electrical power below a first power level required to maintain the plasma at the plurality of hollow cathodes, after electrical breakdown has occurred and wherein the plurality of hollow cathodes are arranged into a plurality of groups of hollow cathodes and the cathode electrode comprises a plurality of electrically conducting pathways, each one of said electrically conducting pathways connecting the hollow cathodes within one group to each other for supplying the electrical power to said group of hollow cathodes, and wherein the hollow cathodes of neighboring groups are spaced apart from one another by an electrically insulating region.

2. The apparatus of claim 1, wherein the power supply controller is configured to reduce the power level by stopping the supply of electrical power to the cathode and anode.

3. The apparatus of claim 1, wherein the power supply controller is configured to reduce the power level after electrical breakdown has occurred by supplying the electrical power at a level greater than or equal to the first power level for a predetermined period of time, wherein the predetermined period of time is a period of time sufficient for electrical breakdown to occur.

4. The apparatus of claim 1, comprising:
means for detecting a characteristic indicative of the occurrence of electrical breakdown,
wherein the power supply controller is configured to reduce the power level of the electrical power below the first power level in response to the characteristic indicative of the occurrence of electrical breakdown being detected.

5. The apparatus of claim 4, wherein the characteristic comprises a change in current and/or voltage.

6. The apparatus of claim 1, wherein the power supply controller is configured to control the power supply to intermittently supply the electrical power as a sequence of voltage pulses, and is configured to set a frequency of the voltage pulses in dependence on a rate of flow of gas through the chamber.

7. The apparatus of claim 1, wherein the inlet and the outlet are disposed on opposite sides of the cathode electrode.

8. The apparatus of claim 7, wherein the chamber is configured such that gas may only flow from one side of the cathode electrode to the other via the plurality of hollow cathodes.

9. The apparatus of claim 1, wherein the anode electrode is disposed on an opposite side of the cathode electrode to the inlet.

10. The apparatus of claim 9, wherein the anode electrode is arranged so as to form a gas flow barrier extending across at least a part of a face of the cathode electrode opposite the anode electrode, such that gas exiting the hollow cathodes is deflected by the anode electrode so as to flow laterally across said face of the cathode electrode.

11. The apparatus of claim 10, wherein a separation distance between the anode electrode and the cathode electrode is set such that a resistance to gas flow laterally in a gap between the anode electrode and the cathode electrode is lower than a resistance to gas flow through the plurality of hollow cathodes, such that a rate of gas flow through the chamber is dependent on the resistance to gas flow through the plurality of hollow cathodes.

12. The apparatus claim 1, wherein a separation distance between the anode electrode and the cathode electrode is set such that a resistance to gas flow laterally in a gap between the anode electrode and the cathode electrode is higher than a resistance to gas flow through the plurality of hollow cathodes.

13. The apparatus of claim 1, comprising:
an electrically insulating or semi-insulating layer disposed between the anode electrode and the cathode electrode, so as to limit an amount of energy delivered to the plasma after electrical breakdown has occurred.

14. The apparatus of claim 1, wherein in use the apparatus is capable of generating the plasma while the gas in the chamber is at atmospheric pressure.

15. The apparatus of claim 1, wherein the plurality of hollow cathodes are arranged in a plurality of rows on the cathode electrode, wherein one group comprises a plurality of hollow cathodes on one row and a neighboring group comprises a plurality of hollow cathodes on an adjacent row.

16. The apparatus of claim 1, wherein an inner surface of each hollow cathode comprises a coating of a material toxic to biological specimens.

17. The apparatus of claim 16, wherein the material comprises at least one of gold, silver, palladium, or copper.

18. The apparatus of claim 1, wherein the power supply is a capacitive drive circuit comprising:
a voltage source having a high voltage terminal and a low voltage terminal;
a first switch connected between the high voltage terminal and a first node;
a second switch connected between the first node and a second node;
a first inductor connected between the second node and a third node via a resistor;
a second inductor connected between the third node and a high voltage output, wherein the high voltage output is connected to the cathode electrode;
a first capacitor connected between the first node and the low voltage terminal;
a second capacitor connected between the third node and the low voltage terminal, wherein the low voltage terminal is further connected to the anode electrode.

19. The apparatus of claim 1, wherein the anode electrode comprises an integrated isolating capacitor, the anode electrode comprising:
a top electrode in the form of a first conductive layer;
an intermediate electrode in the form of a second conductive layer, the first and second conductive layers being separated by an insulating dielectric and connected to one another via a conducting pathway passing through the insulating dielectric; and
a bottom electrode in the form of a third conductive layer separated from the second conductive layer by the insulating dielectric, wherein the second and third conductive layers together function as the integrated isolating capacitor.

20. A modular apparatus comprising: a plurality of plasma reactor modules each comprising the apparatus according to claim 1.

21. The modular apparatus of claim 20, wherein two or more of the plasma reactor modules are connected in series such that gas exiting the outlet of one of said plasma reactor modules then enters the inlet of the next one of said plasma reactor modules in series.

22. The modular apparatus of claim 21, wherein a number of the plasma reactor modules connected in series is selected so as to achieve a desired characteristic of gas exiting the modular apparatus after passing through the number of plasma reactor modules.

23. The modular apparatus of claim 20, wherein two or more of the plasma reactor modules are connected in parallel so as to define a plurality of gas flow paths through the modular apparatus such that gas entering the modular apparatus is divided among the plurality of gas flow paths, and a portion of said gas flowing along each of the gas flow paths must only pass through a corresponding one of said plasma reactor modules connected in parallel before exiting the modular apparatus.

24. The modular apparatus of claim 23, wherein a number of the plasma reactor modules connected in parallel is selected so as to achieve a desired rate of gas flow through the modular apparatus.

* * * * *